(12) United States Patent
Matsumura

(10) Patent No.: US 6,925,101 B2
(45) Date of Patent: Aug. 2, 2005

(54) SEMICONDUCTOR LASER DEVICE, AND METHOD OF MANUFACTURING THE SAME

(75) Inventor: Hiroaki Matsumura, Anan (JP)

(73) Assignee: Nichia Corporation, Tokushima (JP)

( * ) Notice: Subject to any disclaimer, the term of this patent is extended or adjusted under 35 U.S.C. 154(b) by 262 days.

(21) Appl. No.: 10/297,332

(22) PCT Filed: Apr. 25, 2001

(86) PCT No.: PCT/JP01/03548

§ 371 (c)(1),
(2), (4) Date: Dec. 5, 2002

(87) PCT Pub. No.: WO01/95446

PCT Pub. Date: Dec. 13, 2001

(65) Prior Publication Data

US 2003/0128729 A1 Jul. 10, 2003

(30) Foreign Application Priority Data

Jun. 8, 2000 (JP) ........................................ 2000-172797
Apr. 13, 2001 (JP) ........................................ 2001-116197

(51) Int. Cl.$^7$ ................................................ H01S 5/00
(52) U.S. Cl. .............................. 372/46; 372/43; 372/44; 372/45
(58) Field of Search ...................................... 372/43–46

(56) References Cited

U.S. PATENT DOCUMENTS

| | | | | |
|---|---|---|---|---|
| 4,674,094 A | * | 6/1987 | Murakami | 372/45 |
| 5,565,693 A | | 10/1996 | Sasaki et al. | 257/94 |
| 5,687,272 A | | 11/1997 | Vinchant et al. | 385/131 |
| 5,770,466 A | | 6/1998 | Sasaki et al. | 437/89 |
| 5,946,336 A | * | 8/1999 | Mizutani et al. | 372/50 |
| 6,657,237 B2 | * | 12/2003 | Kwak et al. | 257/99 |
| 6,807,201 B1 | * | 10/2004 | Nitta | 372/29.02 |
| 2004/0165635 A1 | * | 8/2004 | Sugimoto et al. | 372/46 |

FOREIGN PATENT DOCUMENTS

| | | | |
|---|---|---|---|
| EP | 0 729 042 A1 | 8/1996 | |
| JP | 52-153686 | 12/1977 | |
| JP | 60-3177 | 1/1985 | |
| JP | 60-003177 | 1/1985 | |
| JP | 6-260727 | 9/1994 | |
| JP | 7-174931 | 7/1995 | |
| JP | 248248 | 9/1996 | |
| JP | 8-248248 | 9/1996 | |
| JP | 2000-4063 | 1/2000 | |
| JP | 2000-31599 | 1/2000 | |
| JP | 3031415 | 4/2000 | |
| JP | 2000-114664 | 4/2000 | |
| JP | 2000-353859 | * 12/2000 | ............. H01S/5/22 |

* cited by examiner

Primary Examiner—Don Wong
Assistant Examiner—Leith Al-Nazer
(74) Attorney, Agent, or Firm—Morrison & Foerster LLP

(57) ABSTRACT

A semiconductor laser device comprises a laminate consisting of a semiconductor layer of first conductivity type, an active layer and a semiconductor layer of second conductivity type, which is different from the first conductivity type, that are stacked in order, with a waveguide region being formed to guide a light beam in a direction perpendicular to the direction of width by restricting the light from spreading in the direction of width in the active layer and in the proximity thereof, wherein the waveguide region has a first waveguide region and a second waveguide region, the first waveguide region is a region where light is confined within the limited active layer by means of a difference in the refractive index between the active layer and the regions on both sides of the active layer by limiting the width of the active layer, and the second waveguide region is a region where the light is confined therein by providing effective difference in refractive index in the active layer.

25 Claims, 17 Drawing Sheets

SEMICONDUCTOR LASER DEVICE, AND METHOD OF MANUFACTURING THE SAME

BACKGROUND OF THE INVENTION

The present invention relates to a semiconductor laser device having stripe ridge being formed. More particularly, the present invention relates to a semiconductor laser device which uses GaN, AlN or InN, or the Group III-V nitride compound semiconductor ($In_bAl_dGa_{1-b-d}N$, $0 \leq b$, $0 \leq d$, $b+d<1$) that is a mixed crystal of the compounds described above.

DESCRIPTION OF RELATED ARTS

Recently, nitride semiconductor laser devices have been receiving increasingly demands for the applications in optical disk systems such as DVD which are capable of recording and reproducing a large amount of information with a high density. Accordingly, vigorous research efforts are being made in the field of nitride semiconductor laser device. Because of the capability to oscillate and emit visible light over a broad spectrum ranging from ultraviolet to red, the nitride semiconductor laser device is expected to have wide applications such as light sources for laser printer and optical network, as well as the optical disk system.

With regard to the structure of the laser device, in particular, various researches have been made and a number of proposals have been made for the structure that enables preferable control of transverse oscillation mode. Among these, ridge waveguide structure is viewed as promising, and is employed in the nitride semiconductor laser device that was shipped first in the world.

The ridge waveguide structure for a semiconductor laser device makes it easier to drive laser oscillation due to the simple structure, although variations are likely to occur in the characteristics of the devices during volume production. This is because the characteristics are caused to vary by variations in the dimensions of mesa stripe in the case of ridge waveguide structure, while the dimensional accuracy of the mesa stripe is determined by the accuracy of etching and the dimensional accuracy of the mesa stripe cannot be made higher than the accuracy of etching. In the case of a semiconductor laser device made from a semiconductor material which is likely to suffer significant etching damage in the active layer or damage caused by exposing the active layer surface to the etching atmosphere, laser characteristics degrade due to the etching damage in the active layer and on the active layer surface when a semiconductor laser device of perfect refractive index guided type is made by etching deeper than the active layer thereby forming ridges. Therefore, such a semiconductor laser device must be made in the effective refractive index type waveguide structure wherein stripes are formed to a depth that does not reach the active layer. However, in the case of effective refractive index type waveguide structure, variations in the device characteristics due to the variation in the stripe configuration mentioned above become significant, thus resulting in considerable variations in the device characteristics during volume production.

In order to apply the nitride semiconductor laser device in the fields described previously, it is indispensable to provide a device which can be mass-produced with stable quality.

However, the structure of the laser devices known at present has a bottle neck in the formation of the ridge waveguide. This is because, while the ridge waveguide is formed by growing nitride semiconductor that constitutes the device, then removing a part of the nitride semiconductor by etching the upper layer thereby forming the ridge which constitutes the waveguide, accuracy of the etching has a great effect on the characteristics of the laser device obtained as mentioned previously. That is, since the transverse mode is controlled by the configuration, particularly height and width, of the ridge that constitutes the ridge waveguide and the far field pattern (F.F.P.) of the laser beam is determined accordingly, an error in the control of the depth of etching when forming the ridge waveguide is a major factor which directly causes variations in the device characteristics.

Dry etching techniques such as reactive ion etching (RIE) have been known for etching nitride semiconductor, but it has been difficult to control the depth of etching to such an accuracy as to completely solve the problem of variations in the device characteristics with these etching techniques.

Design of devices in recent years in a trend to have a multitude of layers that are controlled to be several atoms in thickness formed in the device, such as in the case of super lattice structure. This also contributes to the variations in the device characteristics caused by the etching accuracy. Specifically, when forming the layers which constitute the device structure, the layers are formed with an extremely high accuracy and it is difficult to achieve the device structure of sophisticated design by forming the ridge and other structure with the etching technique having an accuracy lower than the accuracy of film forming by several orders of magnitude, thus making an obstacle to the improvement of device characteristics.

For example, when forming a nitride semiconductor laser device having a high output power in the refractive-index guiding type structure where ridge waveguide is provided on the active layer without etching the active layer, accuracy of etching depth must be controlled so as to keep the effective difference in refractive index between a portion of the active layer right below the ridge and other portion of the active layer to one hundredth. In order to achieve this accuracy, the ridge must be formed by etching while controlling the depth with an accuracy within 0.01 µm till a very small portion of p-type cladding layer remains, in case the layer right above the active layer is the p-type cladding layer. On the other hand, width of the ridge waveguide may have lower accuracy but must be etched with an accuracy of 0.1 µm.

When the RIE process is employed for etching the nitride semiconductor, the layer exposed by etching and the surface thereof are prone to damage, which leads to deterioration of the device characteristics and reliability. Etching can be done in a wet etching process as well as a dry etching process, although wet etching solution which is applicable to nitride semiconductors has not been developed.

As described above, whether nitride semiconductor laser device having high functionality can be made or not in volume production with less variations in the characteristics heavily depends on the accuracy of forming the ridge waveguide in the etching process, and it has critical importance to form the ridge waveguide with a high accuracy.

In light of the circumstances described above, the present inventors have invented a laser device or an end face light emission device and a method for manufacturing the same which, even in the case of a semiconductor laser device of stripe configuration and despite the semiconductor laser device has a resonator of excellent oscillation and wave guiding characteristics, allows stable control of transverse mode and is capable of emitting laser beam of excellent F.F.P., with less variations in the device characteristics even when mass-produced.

SUMMARY OF THE INVENTION

An object of the present invention can be achieved with the semiconductor laser device of the present invention having such a constitution as described below.

A first semiconductor laser device of the present invention comprises a laminate consisting of a semiconductor layer of first conductivity type, an active layer and a semiconductor layer of second conductivity type, which is different from the first conductivity type, that are stacked in order, with a waveguide region being formed to guide a light beam in a direction perpendicular to the direction of width by restricting the light from spreading in the direction of width in the active layer and in the proximity thereof, wherein the waveguide region has a first waveguide region and a second waveguide region, the first waveguide region is a region where light is confined within the limited active layer by means of a difference in the refractive index between the active layer and the regions on both sides of the active layer by limiting the width of the active layer, and the second waveguide region is a region where the light is confined therein by providing effective difference in refractive index in the active layer.

In the first semiconductor laser device of the present invention constituted as described above, since the waveguide region has the first waveguide region where light is confined within the active layer by actually providing a difference in the refractive index between the active layer and the regions on both sides of the active layer, oscillation in the transverse mode can be more surely suppressed in the first waveguide region and the beam can be controlled reliably thereby emitting laser beam having excellent F.F.P.

Also in the first semiconductor laser device which has the second waveguide region constituted by forming a region that has effectively high refractive index in the active layer, since the waveguide can be formed without exposing the active layer that functions as the waveguide directly to the outside in the second waveguide, service life of the device can be prolonged and reliability can be improved. Thus the first semiconductor laser device of the present invention has the features of the first waveguide region and the second waveguide region combined.

In the first semiconductor laser device of the present invention, the active layer in the first waveguide region can be constituted by forming a first ridge that includes the active layer thereby limiting the width of the active layer, and the region having effectively higher refractive index can be constituted by forming a second ridge in the layer of the second conductivity type.

Also in the first semiconductor laser device of the present invention, the first ridge can be formed by etching both sides of the first ridge till the layer of the first conductivity type is exposed and the second ridge can be formed by etching both sides of the second ridge so that the layer of the second conductivity type remains on the active layer.

In the first semiconductor laser device of the present invention, thickness of the layer of the second conductivity type located on the active layer on both sides of the second ridge is preferably 0.1 µm or less, in which case it is made possible to more surely control the transverse mode.

Further in the first semiconductor laser device of the present invention, the second ridge is preferably longer than the first ridge, in which case the reliability can be improved further.

Further in the first semiconductor laser device of the present invention, the first waveguide region preferably includes one resonance end face of the laser resonator in which case laser beam of excellent F.F.P. can be obtained.

Also in the first semiconductor laser device of the present invention, it is preferable to use the one resonance end face as the light emitting plane, in which case laser beam of more excellent F.F.P. can be obtained.

In the first semiconductor laser device of the present invention, length of the first waveguide region is preferably 1 µm or more.

Further in the first semiconductor laser device of the present invention, the semiconductor layer of the first conductivity type, the active layer and the semiconductor layer of the second conductivity type can be formed from nitride semiconductor.

Also in the semiconductor laser device described above, the active layer can be constituted from a nitride semiconductor layer which includes In, in which case the laser can be oscillated in the visible region of relatively short wavelength and in the ultraviolet region.

In the first semiconductor laser device of the present invention, it is preferable to form insulation films on both sides of the first ridge and on both sides of the second ridge, while the insulation film is made of a material selected from the group consisting of oxides of Ti, V, Zr, Nb, Hf and Ta and compounds SiN, BN, SiC and AlN.

A second semiconductor laser device of the present invention comprises a laminate which consists of a layer of the first conductivity type, an active layer and a layer of the second conductivity type that is different from the first conductivity type being stacked in order, and is provided with a stripe waveguide region, wherein the stripe waveguide region has at least a first waveguide region $C_1$ in which a stripe-shaped waveguide based on absolute refractive index is provided and a second waveguide region $C_2$ in which a stripe-shaped waveguide based on effective refractive index is provided, which are arranged in the direction of the resonator. In this constitution, since the laser device of the present invention has the second waveguide region $C_2$ having excellent device reliability and the first waveguide region $C_1$ having excellent controllability of the transverse oscillation and excellent beam characteristic, the laser device combines both of these characteristics thus making it possible to provide various laser devices according to the application without tedious modification of the device design. In the effective refractive index type waveguide, a stripe ridge formed in the layer of the second conductivity type located on the active layer makes it possible to keep the active layer remain in the state of growing, so that the waveguide does not deteriorate when operating the device, thus ensuring excellent reliability of the device. Also because the first waveguide region $C_1$ of refractive index guiding type is provided in the waveguide by etching deeper than the active layer thereby creating a difference in the refractive index on both sides of the waveguide region, the transverse mode can be easily controlled. Providing this as the waveguide of the laser device makes it possible to easily change the transverse mode in the waveguide. In this specification, the waveguide which has the first waveguide region will be referred to as total refractive index type waveguide or absolute refractive index type waveguide in order to avoid confusion with the effective refractive index type waveguide.

In the second semiconductor laser device of the present invention, the absolute refractive index of the first waveguide region $C_1$ is achieved by means of the stripe ridge which is provided so as to include the layer of the first conductivity type, the active layer and the layer of the second conductivity type, and the effective refractive index of the second waveguide region $C_2$ is achieved by means of the stripe ridge which is provided in the layer of second conductivity type. With this constitution, since the first waveguide region $C_1$ and the second waveguide region $C_2$ can be formed easily in the laser device, laser devices of diverse characteristics can be made by simple design.

A third semiconductor laser device of the present invention comprises a laminate which consists of a layer of the first conductivity type, an active layer and a layer of the second conductivity type that is different from the first conductivity type being stacked in order, and is provided with a waveguide region of stripe configuration, wherein the stripe waveguide region has at least a second waveguide region where a portion of the layer of the second conductivity type is removed and a stripe ridge is provided in the layer of the second conductivity type, and a first waveguide region $C_1$ where portions of the layer of second conductivity type, the active layer and the layer of first conductivity type are removed and a stripe ridge is provided in the layer of the first conductivity type, which are arranged in the direction of resonator. With this constitution, since the stripe waveguide region is constituted from the region (first waveguide region $C_1$) where a part of the active layer is removed and the region (second waveguide region $C_2$) where the active layer is not removed, damage to the active layer cased by the removal can be restrained within a part of the waveguide, thereby improving the reliability of the device. For a semiconductor material which is heavily subject to damage, deterioration in the reliability and characteristic of the device caused by the partial removal of the active layer, a laser device having desired reliability and characteristic of the device can be achieved by designing the proportion occupied by the first waveguide region $C_1$, since the first waveguide region $C_1$ is provided only partially. Also by changing the length of (proportion of the waveguide constituted from) and location of the first waveguide region $C_1$ and the second waveguide region $C_2$, laser devices of various characteristics can be made and, particularly, laser devices having desired beam characteristics can be easily obtained.

In the second and third semiconductor laser devices, the first waveguide region $C_1$ and the second waveguide region $C_2$ may also be constituted by removing a part of the laminate structure and forming a ridge waveguide comprising a stripe ridge. With this constitution, laser devices of ridge waveguide structure comprising the stripe ridge having diverse characteristics can be made.

In the second and third semiconductor laser devices, it is preferable to make the stripe of the second waveguide region $C_2$ longer than the first waveguide region $C_1$. With this constitution, a laser device having excellent reliability can be made from a semiconductor material which undergoes greater deterioration due to the formation of the first waveguide region $C_1$, for example a semiconductor material which is damaged when a part of the active layer is removed or exposed to the atmosphere.

Also in the second and third semiconductor laser devices, it is preferable that at least one of the resonance end faces of the semiconductor laser device is formed at the end of the first waveguide region $C_1$. With this constitution, by providing the first waveguide region $C_1$ having excellent controllability of the transverse mode on one of the resonance end faces, guiding of light can be controlled more effectively than in the case of providing the first waveguide region $C_1$ at other position, thereby making it possible to obtain laser devices having diverse characteristics.

Also in the second and third semiconductor laser devices, it is preferable that the resonance end face formed on the end of the first waveguide region $C_1$ is the light emitting plane. With this constitution, by providing the first waveguide region $C_1$ which has excellent controllability of transverse mode on the laser beam emitting plane, beam characteristic can be directly controlled and a laser device having desired F.F.P. and laser beam aspect ratio can be obtained.

Also in the second and third semiconductor laser devices, it is preferable that length of the stripe of the first waveguide region $C_1$ which has the resonance end face on the end face thereof is preferably 1 μm or longer. With this constitution, more reliable control of F.F.P. and laser beam aspect ratio can be achieved and the laser devices of less variations in the characteristics are obtained.

The second and third semiconductor laser devices may also be constituted by using a nitride semiconductor in the layer of the first conductivity type, the active layer and the layer of the second conductivity type. This constitution makes it possible to make laser devices having diverse characteristics from the nitride semiconductor in which it is difficult to form a buried structure of regrowth layer by ion implantation. Since the service life of the device becomes significantly shorter when a part of the active layer is removed by etching or the like in nitride semiconductor, it has been difficult to commercialize a laser device comprising total refractive index type waveguide in which a part of the active layer is removed. However, since a part of the waveguide becomes the first waveguide region $C_1$, a laser device having excellent controllability of the transverse mode can be made while keeping the device life from decreasing.

In the second and third semiconductor laser devices, the active layer may also be constituted from a nitride semiconductor laser which includes In. With this constitution, a laser device which oscillates over a range of wavelengths from ultraviolet to visible light can be made.

Also in the second and third semiconductor laser devices, the first waveguide region $C_1$ may include n-type nitride semiconductor and the second waveguide region $C_2$ may include p-type nitride semiconductor.

Also in the second and third semiconductor laser devices, it is preferable that the second waveguide region $C_2$ has a p-type cladding layer which includes p-type nitride semiconductor and the stripe ridge of the second waveguide region is formed while keeping the thickness of the p-type cladding layer is less than 0.1 μm. With this constitution, a laser device having low threshold current and excellent controllability of the transverse mode can be made. Here thickness of the p-type cladding layer refers to the distance between the exposed surface of the p-type cladding layer in a region where the ridge is not formed and the interface with the adjacent layer below the p-type cladding layer, and "above the active layer" means the location above the interface between the active layer and the adjacent layer located above. That is, in case the active layer and the p-type cladding layer are provided in contact with each other, the exposed surface mentioned above is formed at a depth in the p-type cladding layer where it remains with a thickness greater than 0 and within 0.1 μm. In case a guide layer or the like is provided between the active layer and the p-type cladding layer as in the case of the first embodiment to be described later, the exposed surface mentioned above is formed above the interface between the active layer and the adjacent layer located above, and below a depth in the p-type cladding layer where it remains with a thickness of 0.1 μm or in a layer between the active layer and the p-type cladding layer.

The second and third semiconductor laser devices may also have such a constitution as the nitride semiconductor is exposed on the side faces of the stripe ridge of the first waveguide region $C_1$ and on the side faces of the stripe ridge of the second waveguide region $C_2$, an insulation film is provided on the side face of the stripe ridge, and the insulation film is made of a material selected from the group consisting of oxides of at least one element selected from Ti, V, Zr, Nb, Hf and Ta and at least one kind of compounds SiN, BN, SiC and AlN. With this constitution, satisfactory difference of refractive index can be provided in the stripe ridge of the nitride semiconductor laser device, and the laser device having the stripe waveguide region of excellent controllability of the transverse mode can be made.

In the second and third semiconductor laser devices, width of the stripe ridge is preferably in a range from 1 $\mu$m to 3 $\mu$m. With this constitution, the stripe waveguide region of excellent controllability of the transverse mode can be formed within the waveguide layer in the first waveguide region $C_1$ and the second waveguide region $C_2$, thus achieving a laser device free of kink in the current-optical output characteristic.

A method for manufacturing the semiconductor laser device of the present invention achieves the object of the present invention in a constitution described below.

The method for manufacturing the semiconductor laser device of the present invention comprises a laminating process in which the layer of the first conductivity type, the active layer and the layer of the second conductivity type are stacked in order by using nitride semiconductor to form a laminate, a process of forming a first protective film of stripe configuration after forming the laminate, a first etching process in which the laminate is etched in a portion thereof where the first protective film is not formed thereby to form the stripe ridge in the layer of the second conductivity type, a second etching process in which a third protective film is formed via the first protective film on a portion of the surface which has been exposed in the first etching process and the laminate is etched in a portion thereof where the third protective film is not formed thereby to form the stripe ridge in the layer of first conductivity type, a process in which a second protective film having insulating property made of a material different from the first protective film is formed on the side face of the stripe ridge and on the nitride semiconductor surface exposed by etching, and a process of removing the first protective film after the second protective film has been formed.

DETAILED DESCRIPTION OF THE PREFERRED EMBODIMENTS

Now the semiconductor laser device of the present invention will be described below by way of preferred embodiments with reference to the accompanying drawings.

Figure 1A:
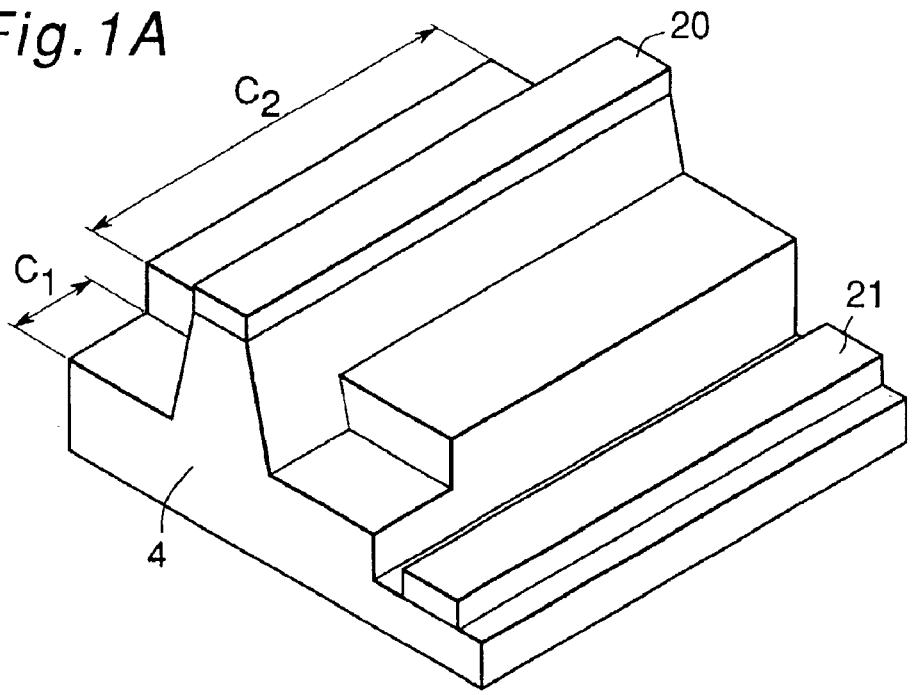
FIG. 1A is a perspective view schematically showing the constitution of the laser device according to an embodiment of the present invention.

The semiconductor laser device of an embodiment according to the present invention has a first waveguide region $C_1$ and a second waveguide region $C_2$ as stripe waveguide region as shown in FIG. 1A.

Figure 1B:
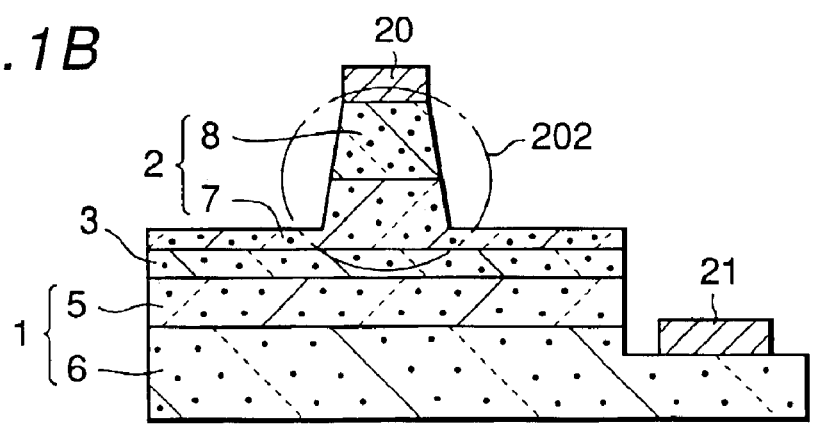
FIG. 1B is a sectional view of the second waveguide region of the laser device of the embodiment.
Figure 1C:
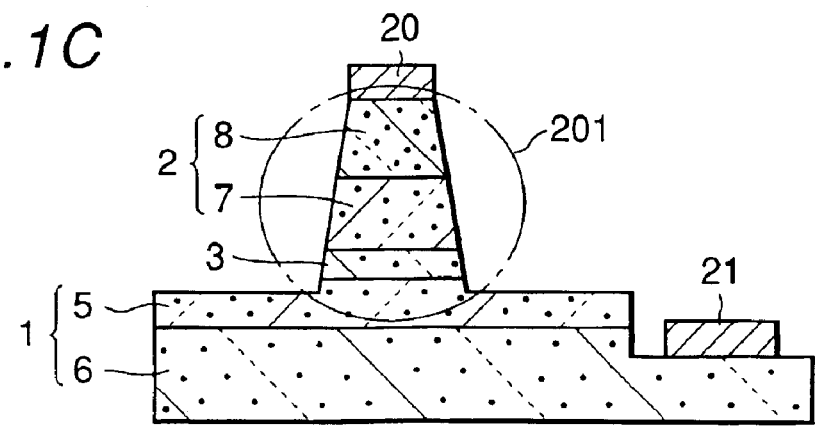
FIG. 1C is a sectional view of the first waveguide region of the laser device of the embodiment.
Figure 2A:
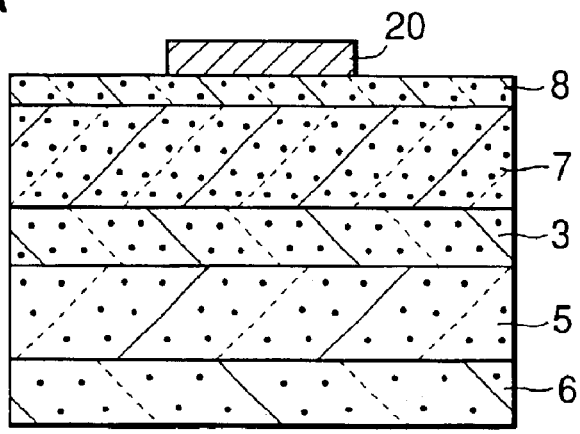
FIG. 2A is a schematic sectional view prior to forming the ridge in the laser device of the prior art.
Figure 2B:
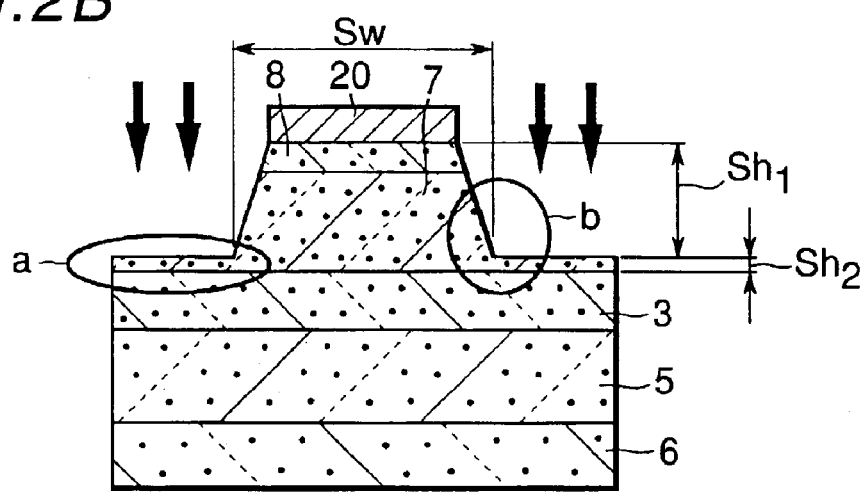
FIG. 2B is a schematic sectional view after forming the ridge in the laser device of the prior art.
Figure 2C:
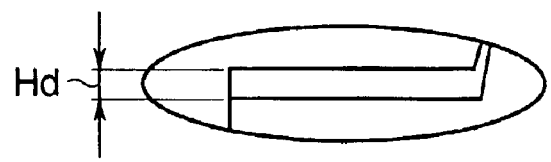
FIG. 2C is partially enlarged view of a part denoted "a" in FIG. 2B.
Figure 2D:
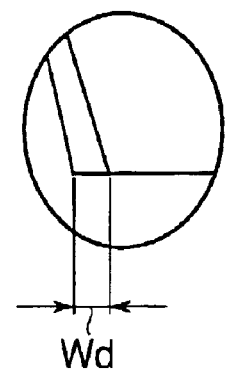
FIG. 2D is partially enlarged view of a part denoted "b" in FIG. 2B.

The first waveguide region $C_1$ is a waveguide region where a ridge (first ridge 201) is formed so as to include an active layer 3 and a difference in the refractive index is created between the active layer 3 and the regions (in the atmosphere in this case) located on both sides thereof as shown in FIG. 1C, thereby to confine light within the active layer 3. In this specification, the waveguide region where light is confined by providing an actual difference in the refractive index between the active layer and the regions on both sides thereof will be referred to as the total refractive index type waveguide.

The second waveguide region $C_2$ is a waveguide region where a ridge (second ridge 202) is formed in the semiconductor layer located on the active layer so that the effective refractive index of the active layer 3 located below the second ridge 202 is made higher than that of the active layer located on both sides thereof as shown in FIG. 1B, thereby to confine light within the active layer 3 having higher effective refractive index. In this specification, the waveguide region where light is confined by providing an effective difference in the refractive index between the active layer and the regions on both sides thereof will be referred to as the effective refractive index type waveguide.

The semiconductor laser according to the present invention is characterized by the total refractive index type waveguide and the effective refractive index type waveguide provided in the waveguide.

Specifically, the second waveguide region $C_2$ is constituted by forming the laminate consisting of the layer of the first conductivity type, the active layer and the layer of the second conductivity type which is different from the first conductivity type being stacked one on another, and forming the second stripe ridge 202 on the layer 2 of the second conductivity type to such a depth as the active layer is not reached, and the first waveguide region $C_1$ is constituted by forming the first stripe ridge 201 so as to include portions of the layer 2 of the second conductivity type, the active layer 3 and the layer 1 of the first conductivity type.

Figure 3A:
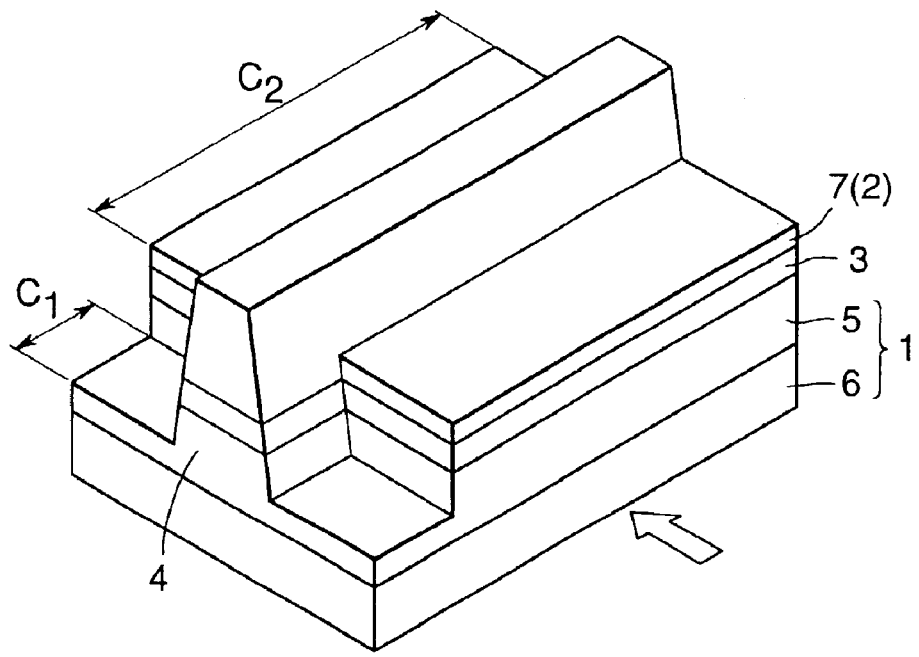
FIG. 3A is a perspective view schematically showing the constitution of layers in the laser device according to an embodiment of the present invention.
Figure 3B:
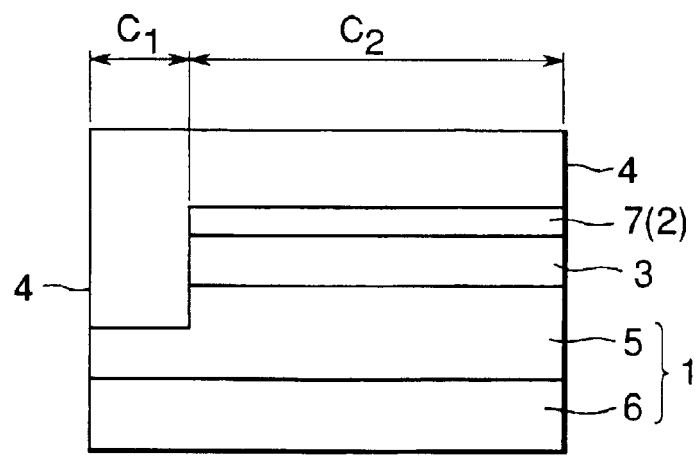
FIG. 3B is a side view of FIG. 3A.
Figure 4A:
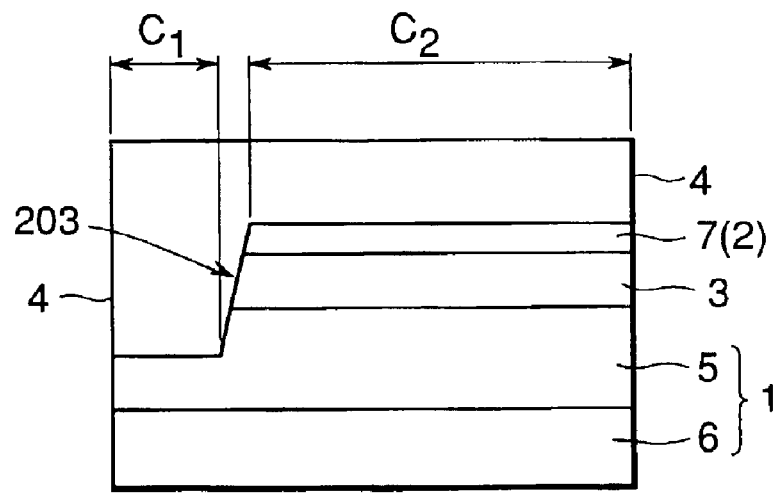
FIG. 4A is a side view of the laser device of a variation according to the present invention.
Figure 4B:
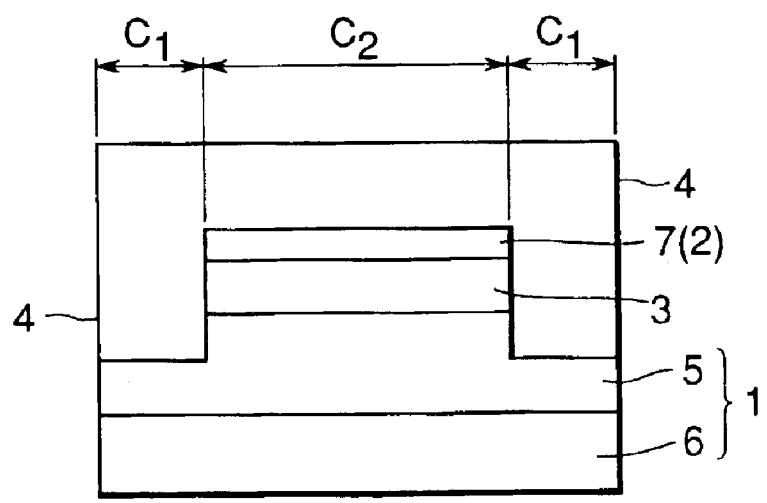
FIG. 4B is a side view of the laser device of another variation according to the present invention.

According to the present invention, by having the first waveguide region $C_1$ and the second waveguide region $C_2$ in the waveguide as described above, semiconductor laser devices of diverse characteristics can be obtained. In the semiconductor laser device of the present invention, the waveguide having the first waveguide region $C_1$ and the second waveguide region $C_2$ can be formed in various forms as shown in FIGS. 3 and 4. FIG. 3A is a partially cutaway perspective view of the laser device of such a structure as the stripe ridge is formed by removing a part of the laminate. FIG. 3B is a cross section viewed in the direction of arrow in FIG. 3A. FIGS. 4A and 4B show a waveguide structure different from that shown in FIG. 3.

According to the present invention, as shown in FIGS. 3 and 4, various constitutions can be employed where the first waveguide region $C_1$ and the second waveguide region $C_2$ are disposed in various arrangements in the resonator direction (longitudinal direction of the stripe ridge). The semiconductor laser according to the present invention may also have a waveguide region other than the first waveguide region $C_1$ and the second waveguide region $C_2$, as a matter of fact. For example, a waveguide region 203 different from the first waveguide region $C_1$ and the second waveguide region $C_2$ may be provided between the first waveguide region $C_1$ and the second waveguide region $C_2$ as shown in FIG. 4A. FIG. 3 shows such a structure as the first waveguide region $C_1$ is provided so as to include one of the resonance end faces of the resonator and the second waveguide region $C_2$ is provided so as to include the other resonance end face. FIG. 4A shows a semiconductor laser device having such a structure as the first ridge 201 which constitutes the first waveguide region $C_1$ and the second stripe ridge 202 which constitutes the second waveguide region $C_2$ are joined via a waveguide region 203 which is formed so as to incline with respect to the vertical direction (perpendicular to the resonator direction). Thus the first waveguide region $C_1$ and the second waveguide region $C_2$ may be formed either substantially continuously in the resonator direction as shown in FIG. 3 or with another region being interposed therebetween as shown in FIG. 4A.

According to the present invention, it is not necessary that width of the first ridge 201 and width of the second ridge 202 are substantially the same. For example, in case the side face of each ridge is formed to incline as shown in FIGS. 1 and 3, width at the base of the first ridge 201 provided to constitute the first waveguide region $C_1$ and width at the base of the second ridge 202 provided to constitute the second waveguide region $C_2$ become inevitably different from each other. The side face of the first ridge and the side face of the second ridge preferably lie in the same plane. While the stripe ridges shown in FIG. 1 and FIG. 3 are formed in the normal mesa configuration where the side faces are inclined so that width decreases from the base to the top, the ridge may also be formed in the inverted mesa configuration where the width increases from the base to the top, and further both side faces of the mesa may be inclined either in the same way or in the opposite manner.

Width of the top surface of the first ridge 201 and width of the top surface of the second ridge 202 may be different from each other. Further, width of the first ridge 201 and width of the second ridge 202 viewed in the horizontal section may be different so as to change discontinuously at the border of the first ridge 201 and the second ridge 202.

[Resonator Structure]

In the semiconductor laser device of this embodiment, the stripe waveguide is constituted by removing a part of the laminate structure and forming the ridge. That is, as shown in FIGS. 1 and 3, the resonator has such a structure as the stripe ridge is formed by removing both sides of a portion which would become the ridge by etching or other means in the laminate consisting of the layer 1 of the first conductivity type, the active layer 3 and the layer 2 of the second conductivity type, which is suited to the so-called ridge waveguide laser device. According to the present invention, since at least the first waveguide region $C_1$ and the second waveguide region $C_2$ are provided by means of the stripe ridge, beam characteristic can be improved and particularly F.F.P. can be controlled in a desired shape from ellipse to true circle, so that various laser devices having diverse characteristics can be provided. The stripe ridge is not limited to the normal mesa configuration shown in FIGS. 1 and 3 as described above, and may be formed in inverted mesa configuration or in stripe shape having vertical side faces. That is, the ridge shape may be changed according to the laser characteristic required.

Also in the semiconductor laser device of the present invention, the ridge may be buried by regrowing crystal on both sides of the ridge after forming the stripe ridges 201, 202 when constituting the first waveguide region $C_1$ and the second waveguide region $C_2$.

As described above, since the present invention assumes the ridge waveguide structure having the stripe ridge, it is made possible not only to achieve production at a lower cost but also to make laser devices having diverse characteristics by arranging the first waveguide region $C_1$ and the second waveguide region $C_2$ in various combinations in the waveguide. For example, since it is made possible to control the beam characteristic, satisfactory F.F.P. can be achieved without using beam correction lens or the like.

In the laser device of the present invention, the first and second stripe ridges 201, 202 provided in the first waveguide region $C_1$ and the second waveguide region $C_2$ have such a configuration as shown in FIG. 1B and FIG. 1C.

The present invention is also applicable to devices other than laser oscillation device, for example end-face light emitting devices such as light emitting diode. The device having the constitution shown in FIG. 1 can be operated as a light emitting diode by driving the device below the threshold of oscillation, and a device which emits light from an end face without laser oscillation can be obtained by inclining the waveguide from the direction which is perpendicular to the end face, rather than making the waveguide perpendicular to the end face.

[Laminate Structure]

Now the structure of the laminate consisting of the layer of first conductivity type, the active layer and the layer of second conductivity type provided in the semiconductor device of this embodiment will be described in detail below.

In the semiconductor device of this embodiment, as shown in FIG. 1, cladding layers 5, 7 are provided in the layer 1 of first conductivity type and the layer 2 of second conductivity type, respectively, and light is confined in the direction of thickness by sandwiching the active layer 3 with the cladding layers 5, 7. Thus the optical waveguide region is provided within the laminate where light is confined in the width direction (perpendicular to the direction of thickness and perpendicular to the direction of resonance) by means of ridge and also light is confined in the direction of thickness by means of the cladding layers 5, 7. In the semiconductor laser device of the present invention, various kinds of semiconductor material known in the prior art can be used such as those based on, for example, GaAlAs, InGaAsP and GaAlInN.

In the semiconductor laser device of the present invention, the stripe waveguide region is formed in correspondence to the ridge in the active layer between the layer of the first conductivity type and the layer of the second conductivity type, and in the vicinity thereof, while the longitudinal direction of the stripe and the direction of light propagation are substantially identical. That is, while the stripe waveguide region is constituted mainly from the active layer in which light is confined, part of light is guided while spreading in the vicinity thereof, and therefore a guide layer may be formed between the active layer and the cladding layer so that the region including the guide layer is used as the optical waveguide layer.

[Second Waveguide Region $C_2$]

The second waveguide region $C_2$ of the present invention is a region provided as the effective refractive index type waveguide in the waveguide of the semiconductor laser device. Specifically, the stripe ridge 201 is formed in the layer 2 of second conductivity type 2 located on the active layer 3 of the laminate, and the stripe waveguide region is formed by providing effective difference in refractive index in the direction of plane (width direction) of the active layer.

In a laser device of effective refractive index type of the prior art in which the waveguide consists of the second waveguide region $C_2$ only, the stripe ridge 202 is formed by etching using a mask 20 after forming the semiconductor layers as shown in FIG. 2. Since the stripe ridge 202 is formed by etching to such a depth that does not reach the active layer thereby to provide the effective difference in refractive index in the active layer (waveguide layer), characteristics of the device vary significantly depending on the width Sw of the stripe, height of the ridge (depth of stripe) $Sh_1$ and distance $Sh_2$ between the surface exposed by etching and the top plane of the active layer as shown in FIG. 2B. These factors cause serious variations in the device characteristics during production thereof. That is, the variations in the device characteristics are caused directly by error Hd in the height of the ridge (depth of stripe) and error Wd in the width of the stripe related to the accuracy of etching shown in FIG. 2C and FIG. 2D. This is because the waveguide region formed in the active layer (waveguide layer) is provided by making use of the effective difference in refractive index corresponding to the ridge 202 by means of the stripe ridge 202 provided in the active layer (waveguide layer), and therefore the configuration of the ridge has a significant influence on the effective difference in refractive index. The error Hd in the height of the ridge is also the error in the distance between the surface exposed by etching and the top plane of the active layer. When the distance $Sh_2$ between the top plane of the active layer and the surface exposed by etching is too large, the effective difference in refractive index becomes smaller resulting in significant influences on the device characteristics such as insufficient confinement of light. As described above, since the effective refractive index is dependent on the distance $Sh_2$ between the top plane of the active layer and the surface exposed by etching, variations in the distance cause variations in the effective refractive index.

Figure 10:
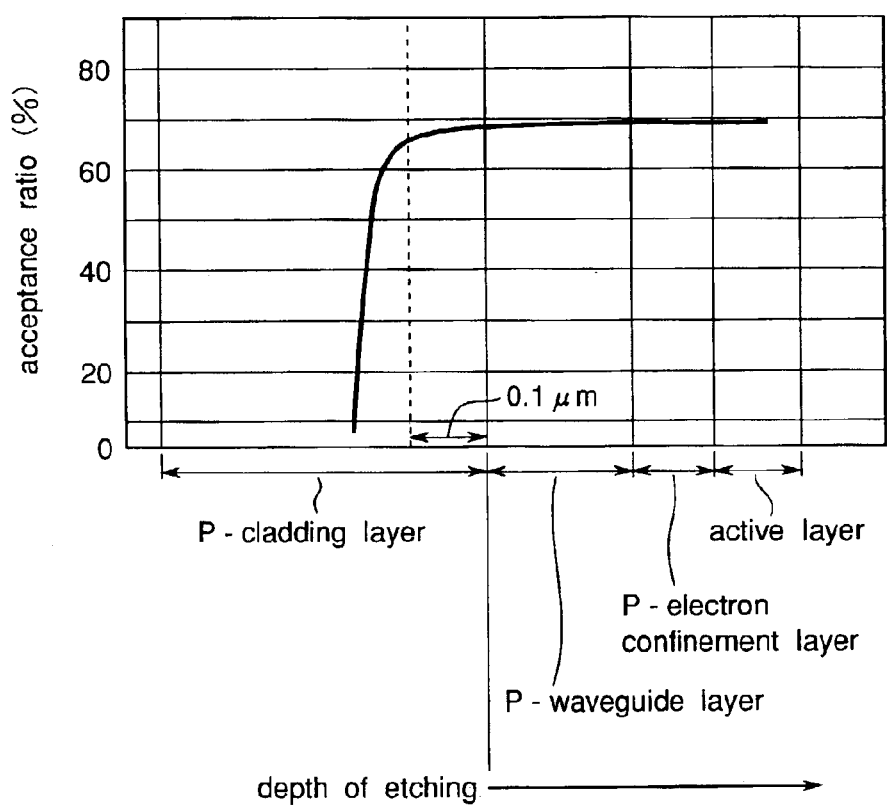
FIG. 10 is a graph showing the acceptance ratio as a function of the depth of etching in the laser device of effective refractive index type.
Figure 11:
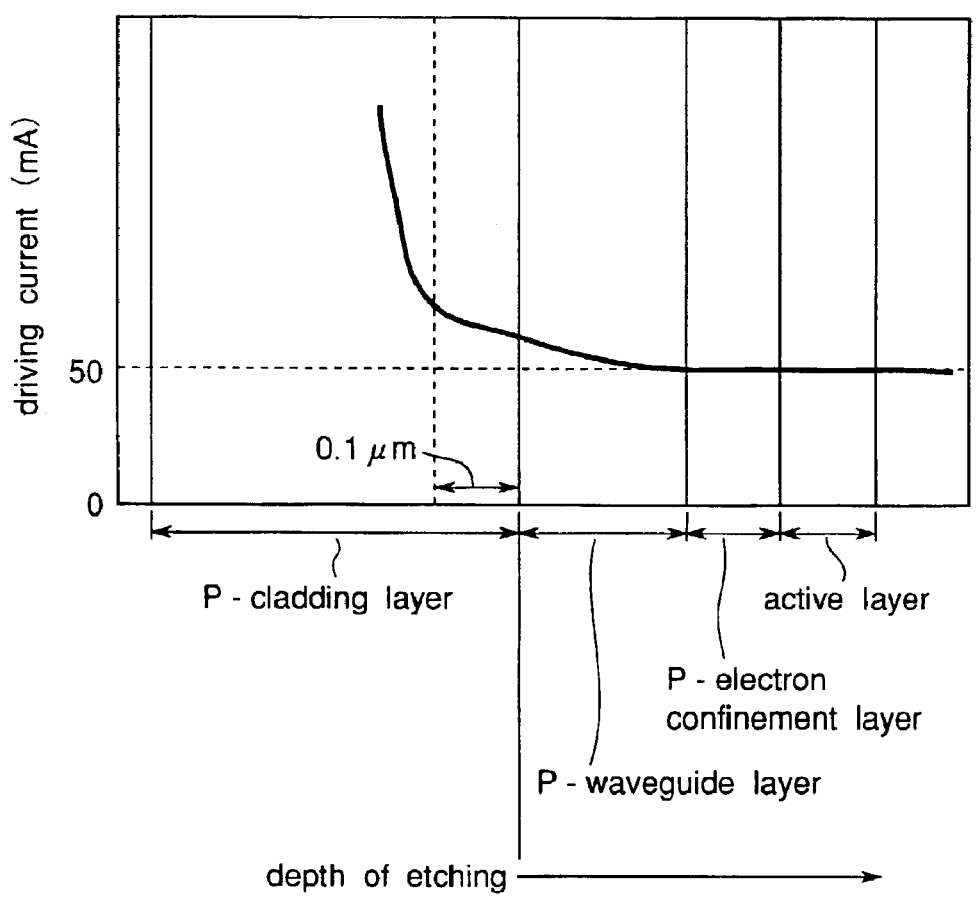
FIG. 11 is a graph showing the drive current as a function of the depth of etching in the laser device of effective refractive index type.
Figure 12:
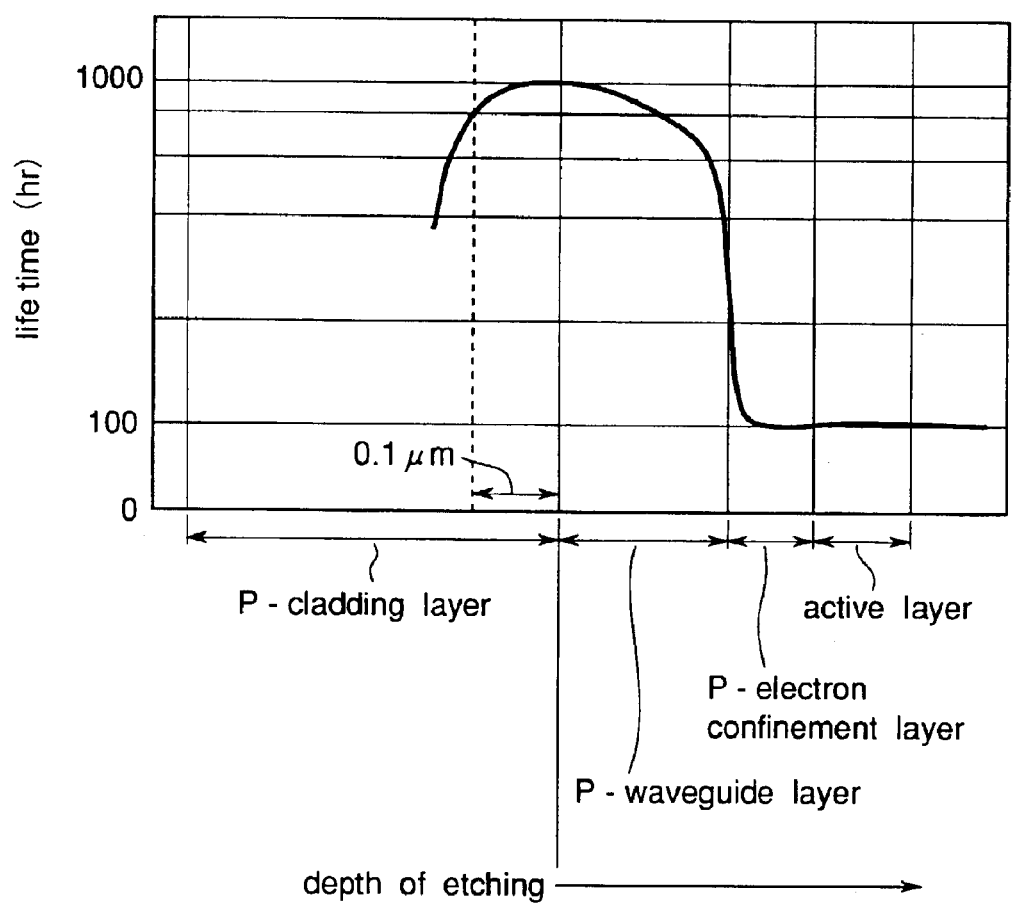
FIG. 12 is a graph showing the service life as a function of the depth of etching in the laser device of effective refractive index type.

FIGS. 10, 11 and 12 show the ratio of products which pass the etching depth inspection, drive current and service life for the laser device of the effective refractive index type of the prior art. As will be understood from the drawings, characteristics of the laser device are very sensitive to the depth of etching.

In the laser device of the present invention, since the second waveguide region $C_2$ formed by etching to such a depth that does not reach the active layer is provided as a part of the waveguide, the active layer is prevented from being damaged by etching in the second waveguide region $C_2$, and therefore reliability of the device can be improved. In the case of a material which undergoes significant device characteristics when the active layer is exposed to the atmosphere, providing the second waveguide region $C_2$ makes it possible to restrict the reliability of the device from deteriorating.

[First Waveguide Region $C_1$]

According to the present invention, laser devices of various characteristics can be easily made by forming the first waveguide region $C_1$ in addition to the second waveguide region $C_2$ as the stripe waveguide region, as described previously. This is an effect brought about by the excellent controllability of the transverse mode of the first waveguide region $C_1$ which is made by forming the stripe ridge 201 that includes portions of the active layer and the layer 1 of the first conductivity type in the laminate structure.

In the first waveguide region $C_1$, since light is confined by means of the actual difference in the refractive index between the active layer and the regions located on both sides thereof by limiting the width of the active layer by the first ridge, it is made possible to confine light more effectively.

Thus it is made possible to surely suppress the unnecessary transverse mode of oscillation and control the transverse mode more effectively.

According to the present invention, as described above, by providing the first waveguide region $C_1$ having excellent controllability of transverse mode in a part of the waveguide region, unnecessary transverse mode of oscillation in the first waveguide region $C_1$ is suppressed thereby improving the controllability of transverse mode of the entire device, and it is made possible to easily obtain laser devices of various beam characteristics.

With the laser device of the present invention, laser beam of a desired configuration can be easily achieved by forming the first waveguide region $C_1$ on one end so as to include the resonance end face of the laser resonator. In other words, it is preferable to form the laser resonance end face 4 so as to correspond to the end face of the first waveguide region $C_1$ as shown in FIG. 3B, FIG. 4A and FIG. 4B. This is because, when the region in the vicinity of the resonance end face is turned into the first waveguide region $C_1$, the transverse mode of light can be controlled before and after reflection on the resonance end face, so that the control of the transverse mode functions more effectively in the waveguide than in a case of providing in other region Also according to the present invention, the laser device having excellent beam characteristics such as F.F.P. and laser beam aspect ratio can be obtained by using the end face of the first waveguide region $C_1$ as the laser resonance end face and using the laser resonance end face as the light emitting plane. This is because, with this constitution, by providing the first waveguide region $C_1$ on the laser beam emitting plane, it is made easier to control the transverse mode in the first waveguide region $C_1$, so that the beam characteristic can be easily controlled. In case the first waveguide region $C_1$ is constituted from the first stripe ridge 201 as shown in FIGS. 3, 4, the transverse mode can be easily controlled and the desired beam characteristic can be obtained with high accuracy by adjusting the width of stripe of the first ridge 201.

Length of the first waveguide region $C_1$ provided on the light emitting plane may be at least one wavelength of the light emitted by the laser, though a length of several times the wavelength is preferable in consideration of the function to control the transverse oscillation mode in which case desired beam characteristic can be achieved.

Specifically, it is preferable to form the first waveguide region $C_1$ with a length of 1 μm or longer, which enables satisfactory control of the transverse oscillation mode. When consideration is given to the manufacturing process, it is preferable to form the first waveguide region with a length of 5 μm or longer since the stripe ridge 201 can be formed with better accuracy with this length.

Width of the active layer (length in the direction perpendicular to the resonator direction) may be 10 μm, preferably 50 μm or longer and more preferably 100 μm or longer. In such a constitution as a pair of positive and negative electrodes oppose each other via a substrate, width of the active layer becomes equivalent to the chip width. In such a constitution as a pair of positive and negative electrodes is provided on the same side of a substrate, a surface is exposed to form electrodes in the layer of the first conductivity type thereon, the length is the chip width minus the width of the portion which is removed to form the exposed surface.

[Constitution of Waveguide]

The laser device of the present invention is characterized by the stripe waveguide region having at least the first waveguide region $C_1$ and the second waveguide region $C_2$, so that the characteristics of the laser devices can be easily modified by changing the arrangement of the waveguide regions in the resonator without modification of the complicated device design. Specifically, by disposing the first waveguide region $C_1$ on the resonance end face as described above, beam characteristic can be easily controlled and desired characteristic can be easily obtained. Also by setting the proportion of the waveguide occupied by the first waveguide region $C_1$ wherein the side face of the active layer is exposed smaller than that of the second waveguide region $C_2$, the laser device of higher reliability can be obtained. This is because the proportion of the active layer which is not damaged by etching can be increased by providing more second waveguide region $C_2$ in the waveguide. As a result, service life of the device can be elongated and variations in the service life among the devices can be decreased.

While the laser device of the present invention has at least the first waveguide region $C_1$ and the second waveguide region $C_2$ as the waveguide, a waveguide region of a configuration other than the first waveguide region $C_1$ and the second waveguide region $C_2$ may also be provided. For example, a flat surface 203 formed to incline between the first waveguide region $C_1$ and the second waveguide region $C_2$ as shown in FIG. 4A may be used. Thus in addition to the first waveguide region $C_1$ and the second waveguide region $C_2$, a waveguide different from these may be provided. Further, the first waveguide region $C_1$ and the second waveguide region $C_2$ may be provided, one each, in the waveguide or may be provided in plurality as shown in FIG. 4B. Also nothing may be provided between the first waveguide region $C_1$ and the second waveguide region $C_2$ as shown in FIG. 3 and FIG. 4B, or an inclination reverse to that shown in FIG. 4A may be provided so that the first waveguide region $C_1$ and the second waveguide region $C_2$ partially overlap each other.

Figure 13A:
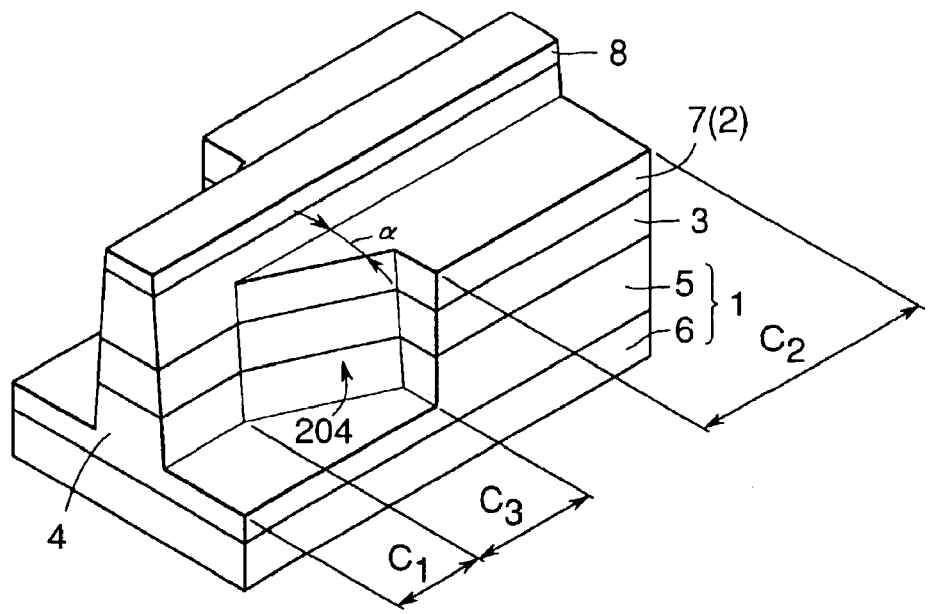
FIG. 13A is a perspective view of the laser device according to the sixth embodiment of the present invention.
Figure 13B:
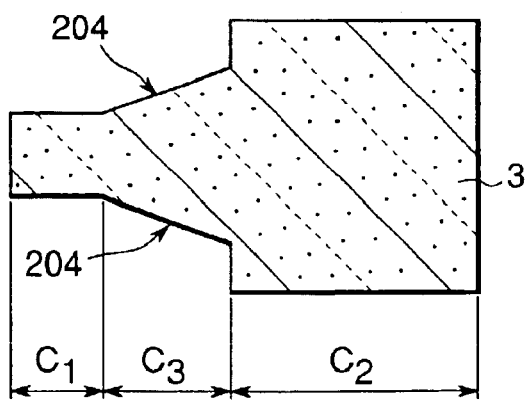
FIG. 13B is a cross sectional view of the laser device according to the sixth embodiment of the present invention.

The laser device of the present invention may also have such a constitution as a third waveguide region $C_3$ is formed in addition to the first waveguide region $C_1$ and the second waveguide region $C_2$ so that the side face of the active layer (side face of waveguide layer) 204 is inclined against the resonator direction. FIG. 13A is a schematic perspective view of the device structure, and FIG. 13B is a sectional view showing a portion near the junction between the upper cladding layer 7 and the active layer 3. In this constitution, the third waveguide region $C_3$ shares the stripe ridge 202 on the upper cladding layer 7 with the second waveguide region $C_2$, and the end face (side face) 204 of the active layer (waveguide layer) is provided in an inclined configuration. In the laser device having the constitution described above, light guided by the side face 204 can be reflected completely by adjusting the angle α between the resonator direction AA and the direction BB of the active layer side face, as shown in FIG. 13B, thus making it possible to guide the light into the first waveguide region $C_1$ first waveguide region $C_1$ striped configuration. Specifically, when the angle α is 70° or less, the incident angle of light in the direction AA of the resonator on the end face 204 can be set to 20° or greater so that total reflection without loss can be achieved. Thus the angle α can be set in a range from 0 to 70° according to the application. For example, when the angle α is 20° or less, the incident angle of light in the direction AA of the resonator on the end face 204 can be set to 70° or greater, in which case total reflection without loss can be achieved. In the second waveguide region $C_2$, while the stripe waveguide region is formed by making use of the effective difference in refractive index in the active layer (waveguide layer), there exists light tat is guided outside of the waveguide region and this portion of light is reflected on the end face of the second waveguide region $C_2$.

In this case, when the loss in light increases, output power decreases leading to a deterioration in the current-optical output slope efficiency. When the second waveguide region $C_2$ is wider than the first waveguide region $C_1$, providing the third waveguide region $C_3$ between the second waveguide region $C_2$ and the first waveguide region $C_1$ decreases the light loss, thus making it possible to guide the light satisfactorily in the junction with the first waveguide region $C_1$ as shown in FIG. 13.

In the laser device of the present invention, the stripe ridges 201, 202 that constitute the first waveguide region $C_1$ and the second waveguide region $C_2$ may have different widths. Beams of different aspect ratios can be achieved by changing the stripe width. Therefore, the first ridge and the second ridge can be formed with widths appropriate for the application in the laser device of the present invention. While a small width requires an accuracy in the control of the width, it also achieves such characteristics as FFP near true circle or it is made possible to change the spread of the beam in correspondence to the width. Specifically, when the width is decreased gradually in a portion 205 of the second waveguide region $C_2$ as shown in FIG. 15, for example, the stripe width in the junction with the first waveguide region $C_1$ can be made equal to the stripe width $S_{w2}$, thus making it possible to extract laser beam of various modes in correspondence to the width of the first waveguide region $C_1$. In FIG. 15, a portion where width of the second waveguide region $C_2$ is decreased gradually is shown as the third waveguide region $C_3$.

In FIG. 15, in order to constitute the second waveguide region $C_2$, the first ridge 202 having width $S_{w1}$ larger than the stripe width $S_{w2}$ of the first ridge that constitutes the first waveguide region $C_1$ is provided thereby to form a waveguide which undergoes less variation in the characteristic with a change in the effective refractive index. In the third waveguide region $C_3$, at the same time, a region 205 having stripe width inclined in the waveguide is provided so as to join the waveguide regions of different stripe widths smoothly, thereby minimizing the loss in the junction. The ridge for constituting the third waveguide region $C_3$ may be provided above the active layer as shown in the drawing, or at a depth reaching the layer of first conductivity by etching similarly to the first waveguide region $C_1$, or at a position located inbetween.

The stripe ridge for constituting the first and second waveguide regions of the present invention may be formed in various configurations, for example in a tapered configuration where the stripe width varies along the direction of stripe (longitudinal direction of stripe). Specifically, as exemplified by the first embodiment or shown in FIG. 15, in the waveguide structure having the first waveguide region $C_1$ disposed at the light emitting end, the second waveguide region $C_2$ having larger stripe width may be formed in such a configuration that the stripe width decreases toward the narrower first waveguide region $C_1$, thereby decreasing the light waveguide to the junction of both portions. Such a tapered stripe may be formed partially as the stripe of each waveguide region, or formed in a tapered configuration over the entire length of the stripe, or in such a configuration as a plurality of tapered stripes having width which decreases toward both ends thereof.

[Stripe in Nitride Semiconductor]

The semiconductor laser device of the present invention constituted from the semiconductors of the first conductivity type and the second conductivity type and the active layer made of nitride semiconductor will be described below.

The nitride semiconductor used in the laser device of the present invention may be GaN, AlN or InN, or a mixed crystal thereof, namely the Group III-V nitride semiconductor ($In_bAl_dGa_{1-b-d}N$, $0 \leq b$, $0 \leq d$, $b+d \leq 1$). Mixed crystals made by using B as the Group III element or by partially replacing N of the Group V element with As or P may also be used. The nitride semiconductor can be made to have a desired conductivity type by adding an impurity of appropriate conductivity type. As an n-type impurity used in the nitride semiconductor, the Group IV or VI elements such as Si, Ge, Sn, S, O, Ti and Zr may be used, while Si, Ge or Sn is preferable and most preferably Si is used. As the p-type impurity, Be, Zn, Mn, Cr, Mg, Ca or the like may be used, and Mg is preferably used. As a specific example of the laser device of the present invention, a nitride semiconductor laser device will be described below. The nitride semiconductor laser device herein refers to a laser device where nitride semiconductor is used in any of the layer of the first conductivity type, the active layer and the layer of the second conductivity type which constitute the laminate, or preferably in all of these layers. For example, cladding layers made of nitride semiconductor are formed in the layer of the first conductivity type and the layer of the second conductivity type while the active layer is formed between the two cladding layers thereby forming the waveguide. More specifically, the layer of the first conductivity type includes a n-type nitride semiconductor layer and the layer of the second conductivity type includes a p-type nitride semiconductor layer, while the active layer includes nitride semiconductor laser which includes In.

(Active Layer)

According to the present invention, when the semiconductor laser device of the present invention is constituted from nitride semiconductor, providing the nitride semiconductor layer which includes In in the active layer makes it possible to emit laser beam over a range of wavelengths from blue to red light in the ultraviolet and visible regions. While the laser device may suffer very serious damage on the nitride semiconductor laser including In when the active layer is exposed to the atmosphere, such a damage to the device can be minimized according to the present invention since the device includes the second waveguide region $C_2$ which is constituted from the first ridge 202 provided at such a depth that does not reach the active layer. This is because the low melting point of In makes the nitride semiconductor which includes In easy to decompose and evaporate and prone to damage during etching, and makes it difficult to maintain the crystallinity during the process following the exposure of the active layer, thus resulting in a shorter service life of the device.

FIG. 12 shows the relationship between the depth of etching for forming the stripe ridge and the device life. As will be seen from the drawing, device life decreases dramatically when etching process reaches the active layer which has the nitride semiconductor which includes In, and exposure of the active layer leads to serious deterioration of the reliability of the laser device.

Since the laser device of the present invention is provided with the first waveguide region $C_1$ and the second waveguide region $C_2$ as the waveguide, the laser device of excellent reliability can be achieved even in a nitride semiconductor laser device which would otherwise undergo deterioration in the characteristics when the active layer is exposed to the atmosphere. This is because the first ridge 201 provided for the constitution of the first waveguide region $C_1$ constitutes only a part of the waveguide so that reliability of the device can be prevented from deteriorating. When length of the resonator is set to about 650 μm and length of the first ridge 201 provided for the constitution of the first waveguide region $C_1$ is set to 10 μm in the nitride semiconductor laser device of the present invention, for example, it is confirmed that the device does not undergo deterioration in reliability due to the active layer being exposed in the first ridge, and service life of several thousands of hours is ensured with operation of 5 mW in output power.

In the nitride semiconductor laser device of the present invention, width of the stripe of the ridge that constitutes the first waveguide region $C_1$ or the second waveguide region $C_2$ is preferably set in a range from 0.5 to 4 μm, or more preferably in a range from 1 to 3 μm in which case it is made possible to oscillate in stable transverse mode wit the fundamental (single) mode. When stripe width of the ridge is less than 1 μm, it becomes difficult to form the ridge, while width of 3 μm or greater may cause multi-mode oscillation in the transverse mode depending on the wavelength of laser oscillation, and width of 4 μm or greater may make it impossible to achieve stable transverse mode. According to the present invention, controlling the width in a range from 1.2 to 2 μm makes it possible to further effectively stabilize the transverse mode in a high optical output power (effectively suppress the oscillation in unnecessary transverse mode). According to the present invention, while it is good for the stripe width of the ridge when either of the first waveguide region $C_1$ or the second waveguide region $C_2$ is within the range described above, it is preferable to set the stripe ridge 201 of the first waveguide region $C_1$ within the range described above in case the first waveguide region $C_1$ is provided on the light emitting side of the resonator plane. Also the present invention is not limited to such a narrow stripe structure as described above, and may be applied to a stripe having a width of 5 μm or greater. Also in such a constitution as the first waveguide region $C_1$ is disposed on the end of the waveguide, the stripe width of the second waveguide region $C_2$ can be set relatively freely for the control of the laser beam characteristic by means of mainly the first waveguide region $C_1$.

In the nitride semiconductor laser device of the present invention, when the end face of the first waveguide region $C_1$ is used as the resonance end face (light emitting plane), the laser device having excellent controllability of transverse mode, F.F.P. aspect ratio and device reliability can be obtained. This is because, as described previously, light emitted from the laser device can be controlled immediately before the emission by etching deeper than the active layer thereby providing the first waveguide region $C_1$ on the light emitting side of the resonator plane, thereby making it possible to obtain laser beams of various shapes and spot sizes.

The active layer may have quantum well structure and, in that case, may be either single quantum well or multiple quantum well structure. High power laser device and end face light emitting device of excellent light emitting efficiency can be made by employing the quantum well structure. The second stripe ridge 202 provided for constituting the second waveguide region $C_2$ is formed by etching to such a depth that does not reach the active layer. In this specification, the statement that the second stripe ridge 202 is located above the active layer means that the formation by etching to such a depth that does not reach the active layer. That is, the second stripe ridge 202 that constitutes the second waveguide region $C_2$ is positioned above the interface between the active layer and the layer formed in contact and above thereof.

The active layer of the nitride semiconductor is preferably the nitride semiconductor which includes In as described above, and specifically a nitride semiconductor represented by $Al_xIn_yGa_{1-x-y}N$ ($0 \leq x \leq 1$, $0 < y \leq 1$, $x+y \leq 1$) is preferably used. In this case, the nitride semiconductor described here is preferably used as the well layer in the active layer of quantum well structure. In the wavelength region (from 380 nm to 550 nm) ranging from near ultraviolet to visible green light, $In_yGa_{1-y}N$ ($0<y0$) is preferably used. Also in a region of longer wavelengths (red), $In_yGa_{1-y}N$ ($0<y0$) can be used similarly and, at this time, laser beam of a desired wavelength can be emitted by changing the proportion y of mixing In. In a region of wavelengths shorter than 380 nm, since the wavelength which corresponds to the forbidding band width of GaN is 365 nm, band gap energy nearly equal to or greater than that of GaN is required, and therefore $Al_xIn_yGa1_{1-x-y}N$ ($0<x \leq 1$, $0<y \leq 1$, $x+y \leq 1$) is used.

In case the active layer is formed in the quantum well structure, thickness of the well layer is in a range from 10 Å to 300 Å, and preferably in a range from 20 Å to 200 Å, which allows it to decrease Vf and the threshold current density. When the crystal is taken into consideration, a layer of relatively homogeneous quality without much variations in the thickness can be obtained when the thickness is 20 Å or greater, and the crystal can be grown while minimizing the generation of crystal defects by limiting the thickness within 200 Å. There is no limitation on the number of well layers in the active layer, which may be 1 or more. When four or more active layers with larger thickness of layers constituting the active layer, total thickness of the active layers becomes too large and the value of Vf increases. Therefore, it is desirable to restrict the thickness of the well layer within 100 Å thereby to restrain the thickness of the active layer. In the case of LD and LED of high output power, setting the number of well layers in a range from 1 to 3 makes it possible to obtained devices of high light emission efficiency and is desirable.

The well layer may also be doped or undoped with p- or n-type impurity (acceptor or donor). When nitride semiconductor which includes In is used as the well layer, however, increase in the concentration of n-type impurity leads to lower crystallinity and therefore it is preferable to restrict the concentration of n-type impurity thereby to achieve make the well layer of good crystallinity. Specifically, in order to achieve best crystallinity, the well layer is preferably grown without doping with the n-type impurity concentration kept within $5 \times 10^{16}/cm^3$. The state of the n-type impurity concentration kept within $5 \times 10^{16}/cm^3$ means an extremely low level of concentration of n-type impurity, and the well layer can be regarded as including substantially no n-type impurity. When the well layer is doped with n-type impurity, controlling the n-type impurity concentration within a range from $1 \times 10^{18}/cm^3$ to $5 \times 10^{16}/cm^3$ makes it possible to suppress the degradation of crystallinity and increase the carrier concentration.

There is no limitation to the composition of the barrier layer, and nitride semiconductor similar to that of the well layer can be used. Specifically, a nitride semiconductor which includes In such as InGaN having lower proportion of In than the well layer, or a nitride semiconductor which includes Al such as GaN, AlGaN may be used. Band gap energy of the barrier layer must be higher than that of the well layer. Specific composition may be $In_\beta Ga_{1-\beta}N$ ($0 \leq \beta < 1$, $\alpha > \beta$), GaN, $Al_\gamma Ga_{1-\gamma}N$ ($0 < \gamma \leq 1$), and preferably $In_\beta Ga_{1-\beta}N$ ($0 \leq \beta < 1$, $\alpha > \beta$), GaN which makes it possible to form the barrier layer of good crystallinity. This is because growing a well layer made of a nitride semiconductor which includes In directly on a nitride semiconductor which includes Al such as AlGaN leads to lower crystallinity, eventually resulting in impeded function of the well layer. When $Al_\gamma Ga_{1-\gamma}N$ ($0 < \gamma \leq 1$) is used in the barrier layer, the above problem can be avoided by providing the barrier layer which includes Al on the well layer and providing a multi-layered barrier layer comprising $In_\beta Ga_{1-\beta}N$ ($0 \leq \beta < 1$, $\alpha > \beta$), GaN below the well layer. Thus in the multiple quantum well structure, the barrier layer sandwiched between the active layers is not limited to a single layer (well layer/barrier layer/well layer), and two or more barrier layers of different compositions and/or impurity concentrations may be stacked such as well layer/barrier layer (1)/barrier layer (2)/well layer. Letter $\alpha$ represents the proportion of In in the well layer, and it is preferable to make the proportion of In $\beta$ in the barrier layer lower than that of the well layer as $\alpha > \beta$.

The barrier layer may be doped or undoped with the n-type impurity, but preferably doped with the n-type impurity. When doped, the n-type impurity concentration in the barrier layer is preferably $5 \times 10^{16}/cm^3$ or higher and lower than $1 \times 10^{20}/cm^3$. In the case of LED which is not required to have a high output power, for example, the n-type impurity concentration is preferably in a range from $5 \times 10^{16}/cm^3$ to $2 \times 10^{18}/cm^3$. For LED of higher output power and LD, it is preferable to dope in a range from $5 \times 10^{17}/cm^3$ to $1 \times 10^{20}/cm^3$ and more preferably in a range from $1 \times 10^{18}/cm^3$ to $5 \times 10^{19}/cm^3$. When doping to such a high concentration, it is preferable to grow the well layer without doping or with substantially no n-type impurity included. The reason for the n-type impurity concentration being different among the regular LED, the high-power LED and the high-power LD (output power in a range from 5 to 100 mW) is that a device of high output power requires higher carrier concentration in order to drive with larger current for higher output power. Doping in the range described above, as described above, it is made possible to inject the carrier to a high concentration with good crystallinity.

In the case of a nitride semiconductor device such as lower-power LD, LED or the like, in contrast, a part of the barrier layer of the active layer may be doped with the n-type impurity or the entire barrier layers may be formed with substantially no n-type impurity included. When doping with the n-type impurity, all the barrier layers of the active layer may be doped or a part of the barrier layers may be doped. When part of the barrier layers is doped with the n-type impurity, it is preferable to dope the barrier layer which is disposed on the n-type layer side in the active layer. Specifically, when the barrier layer Bn (n=1, 2, 3 . . . ) which is nth layer from the n-type layer side, electrons are effectively injected into the active layer and a device having excellent light emission efficiency and quantum efficiency can be made. This also applies to the well layer, as well as the barrier layer. When both the barrier layer and the active layer are doped, the effect described above can be achieved by doping the barrier layer Bn (n=1, 2, 3 . . . ) which is nth layer from the n-type layer side and the mth well layer Wm (m=1, 2, 3 . . . ), namely doping the layer nearer to the n-type layer first.

While there is no limitation to the thickness of the barrier layer, the thickness is preferably not larger than 500 Å, and more specifically from 10 to 300 Å similarly to the active layer.

In the nitride semiconductor laser device of the present invention, it is preferable that the laminate structure includes the n-type nitride semiconductor layer for the layer of first conductivity type and the p-type nitride semiconductor for the layer of second conductivity type. Specifically, the n-type cladding layer and the p-type cladding layer are provided in the layers of the respective types, thereby to form the waveguide. At this time, a guide layer and/or an electron confinement layer may be formed between the cladding layers and the active layer.

(p-type Cladding Layer)

In the nitride semiconductor laser device of the present invention, it is preferable to provide the p-type cladding layer which includes the p-type nitride semiconductor (first p-type nitride semiconductor) as the layer of second conductivity type or the layer of first conductivity type. In this case, the waveguide is formed in the laminate structure by providing the n-type cladding layer which includes the n-type nitride semiconductor layer in the layer of the conductivity type different from that of the layer wherein the p-type cladding layer is provided. The nitride semiconductor used in the p-type cladding layer is required only to have a difference in the refractive index large enough to confine light, and nitride semiconductor layer which includes Al is preferably used. This layer may be either a single layer or a multi-layered film. Specifically, a super lattice structure having AlGaN and GaN stacked one on another achieves better crystallinity and is therefore preferable. This layer may be either doped with p-type impurity or not doped. For a laser device oscillating at a long wavelength in a range from 430 to 550 nm, the cladding layer is preferably made of GaN doped with p-type impurity. While there is no limitation to the film thickness, thickness in a range from 100 Å to 2 $\mu$m, or more preferably from 500 Å to 1 $\mu$m makes the film function satisfactorily as the light confinement layer.

Also according to the present invention, the electron confinement layer and/or the optical guide layer to be described later may be provided between the active layer and the p-type cladding layer. When providing the optical guide layer, it is preferable provide the optical guide layer also between the n-type cladding layer and the active layer, in such a structure as the active layer is sandwiched by optical guide layers. This creates SCH structure in which light can be confined by the cladding layer by making the proportion of Al content higher in the cladding layer than in the guide layer thereby providing a difference in refractive index. In case the cladding layer and the guide layer are formed in multi-layered structure, proportion of Al content is determined by the mean proportion of Al.

(p-type Electron Confinement Layer)

The p-type electron confinement layer which is provided between the active layer and the p-type cladding layer, or preferably between the active layer and the p-type optical guide layer also function to confine the carrier in the active layer thus making it easier to oscillate by reducing the threshold current, and is made of AlGaN. Particularly more effective electron confinement can be achieved by providing the p-type cladding layer and the p-type electron confinement layer in the layer of second conductivity type. When AlGaN is used for the p-type electron confinement layer, while the above mentioned function can be reliably achieved by doping with the p-type impurity, carrier confining function can also be achieved even without doping. Minimum film thickness is 10 Å and preferably 20 Å. The above mentioned function will be achieved satisfactorily by forming the film to a thickness within 500 Å and setting the value of x in formula $Al_xGa_{1-x}N$ to 0 or larger, preferably 0.2 or larger. The n-type carrier confinement layer may also be provided on the m-type layer side for confining the holes within the active layer. Confinement of holes can be done without making such an offset (difference in the band gap from the active layer) as in the case of electron confinement. Specifically, a composition similar to that of the p-type electron confinement layer may be used. In order to achieve good crystallinity, this layer may be formed from a nitride semiconductor layer which does not includes Al, and a composition similar to that of the barrier layer of the active layer may be used. In this case, it is preferable to dispose the n-type barrier layer which confines the carrier nearest to the n-type layer in the active layer, or within the n-type layer in contact with the active layer. Thus by providing the p-type and n-type carrier confinement layers in contact with the active layer, the carrier can be injected effectively into the active layer or into the well layer. In another form, a layer which makes contact with the p-type or n-type layer in the active layer can be used as the carrier confinement layer.

[p-type Guide Layer]

According to the present invention, good waveguide can be formed from nitride semiconductor by providing the guide layer which sandwiches the active layer at a position inside of the cladding layer thereby forming the optical waveguide. In this case, thickness of the waveguide (the active layer and the guide layers on both sides thereof) is set to within 6000 Å for suppressing abrupt increase in the oscillation threshold current. Preferably the thickness is within 4500 Å to make continuous oscillation possible with long service life at a restricted threshold current in the fundamental mode. Both guide layers are preferably formed to substantially the same thickness in a range from 100 Å to 1 μm, more preferably in a range from 500 Å to 2000 Å in order to form good optical waveguide. The guide layer is made of nitride semiconductor, while it suffices to have a band gap energy sufficient to form the waveguide compared to the cladding layer to be provided on the outside thereof, and may be either a single film or a multi-layered film. Good waveguide can be formed by making the optical guide layer having a band gap energy equal to or greater than that of the active layer. In the case of quantum well structure, band gap energy is made greater than that of the well layer, and preferably greater than that of the barrier layer. Further, good optical waveguide can be formed by providing a band gap energy for about 10 nm or larger than the wavelength of light emitted in the active layer in the optical guide layer.

For the p-type guide layer, it is preferable to use undoped GaN in the range of oscillation wavelengths from 370 to 470 nm, and use a multi-layered structure of InGaN/GaN in a range of relatively long wavelengths (450 μm and over). This makes it possible to increase the refractive index in the waveguide constituted from the active layer and the optical guide layer, thereby increasing the difference in the refractive index from the cladding layer. In a range of shorter wavelengths within 370 nm, nitride semiconductor which includes Al is preferably used since the absorption edge is at 365 nm. Specifically, $Al_xGa_{1-x}N$ (0<x<1) is preferably used to form a multi-layered film made of AlGaN/GaN, multi-layered film made by alternate stacking thereof or a super lattice multi-layered film in which each layer has super lattice structure. Constitution of the n-type guide layer is similar to that of the p-type guide layer. Satisfactory waveguide can be can be made by using GaN, InGaN in consideration of the energy band gap of the active layer, and forming multi-layered film comprising InGaN and GaN stacked alternately with the proportion of In content being decreased toward the active layer.

(n-type Cladding Layer)

In the nitride semiconductor laser device of the present invention, nitride semiconductor used in the n-type cladding layer is required only to have a difference in the refractive index large enough to confine light similarly to the p-type cladding layer, and a nitride semiconductor layer which includes Al is preferably used. This layer may be either a single layer or a multi-layered film. Specifically, a super lattice structure having AlGaN and GaN stacked one on another. The n-type cladding layer functions as the carrier confinement layer and the light confinement layer. In case multi-layered structure is employed, it is preferable to grow nitride semiconductor layer including Al, specifically AlGaN as described previously. Further, this layer may be either doped with n-type impurity or not doped, and also one of the constituting layers may be doped. For a laser device oscillating at a long wavelength in a range from 430 to 550 nm, the cladding layer is preferably made of GaN doped with n-type impurity. While there is no limitation to the film thickness, similarly to the case of the p-type cladding layer, thickness in a range from 100 Å to 2 μm, or more preferably from 500 Å to 1 μm makes the film function satisfactorily as the light confinement layer.

In the nitride semiconductor laser device, good insulation can be achieved by locating the position, where the stripe ridge is formed, within the nitride semiconductor layer which includes Al and providing an insulation film on the exposed nitride semiconductor surface and on the side face of the ridge. A laser device without leak current can also be made by providing electrodes on the insulation film. This is because almost no material exists that can achieve good ohmic contact in the nitride semiconductor layer which includes Al, and good insulation without leak current can be achieved by forming the insulation film and electrode on the semiconductor surface. When the electrode is provided on the nitride semiconductor layer which does not include Al, in contrast, ohmic contact can be easily formed between the electrode and the nitride semiconductor. When the electrode is formed on the nitride semiconductor layer which does not include Al via the insulation film, microscopic pores in the insulation film cause leakage depending on the film quality of the insulation film and the electrode. In order to solve this problem, it is necessary to form the insulation film having a thickness sufficient to provide the required level of insulation or to design the shape and position of the electrode so as not to overlap the semiconductor surface, thus imposing a significant restraint on the design of the laser device constitution. It is important where to provide the ridge, because the surface of the nitride semiconductor on both sides of the ridge exposed when forming the ridge has far greater area than the side face of the ridge, and satisfactory insulation can be secured in this surface. Thus a laser device having a high degree of freedom in the design can be made where electrodes of various configurations can be applied and the location of forming the electrode can be determined relatively freely, which is very advantageous in forming the ridge. For the nitride semiconductor layer which includes Al, AlGaN or the super lattice multi-layered structure of AlGaN/GaN described above is preferably used.

The first ridge 201 and the second stripe ridge 202 of striped configuration provided as the first waveguide region $C_1$ and the second waveguide region $C_2$ are formed by removing both sides of each ridge as shown in FIGS. 1B and 1C. The ridge 202 is provided on the upper cladding layer 7 and the surface of the upper cladding layer 7 exposed in a region other than the ridge determines the depth of etching.

[Electrode]

The laser device of the present invention is not limited to the electrode configuration provided on the stripe ridge and the second ridge. As shown in FIG. 1 and FIG. 7, for example, the electrode may be formed on almost the entire surface of the first stripe ridge 201 and the second stripe ridge 202 provided as the first waveguide region $C_1$ and the second waveguide region $C_2$. Also the electrode may be provided on the second waveguide region $C_2$ only thereby injecting the carrier into the second waveguide region $C_2$ with preference. On the contrary, the electrode may be provided on the first waveguide region $C_1$ only, with the waveguide being functionally separated in the direction of resonator.

[Insulation Film]

In the laser device of the present invention, in case a part of the laminate is removed and a stripe ridge is provided to form the resonator, it is preferable to form the insulation film on the side face of the stripe and on the plane (surface whereon the ridge is provided) on both sides of the ridge which continues thereto. For example, after the stripe ridge shown in FIG. 1 is provided, the insulation film is provided in such a way as to extend from the side face of the ridge to the surfaces on both sides of the ridge.

Figure 7A:
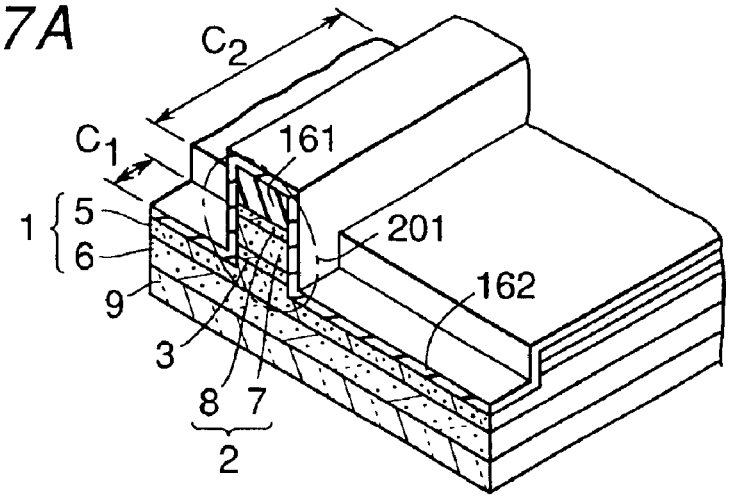
FIG. 7A through FIG. 7D are perspective views showing the process of forming the electrodes in the laser device of the present invention.
Figure 7B:
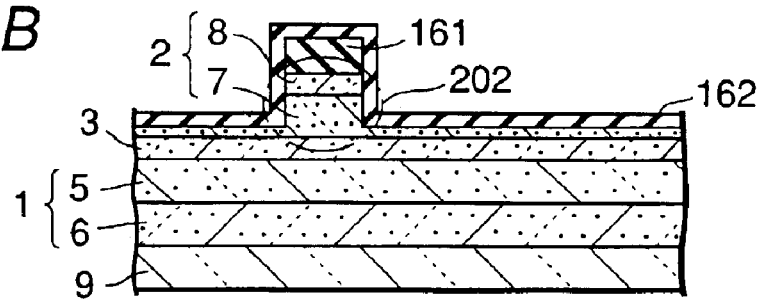
Figure 7C:
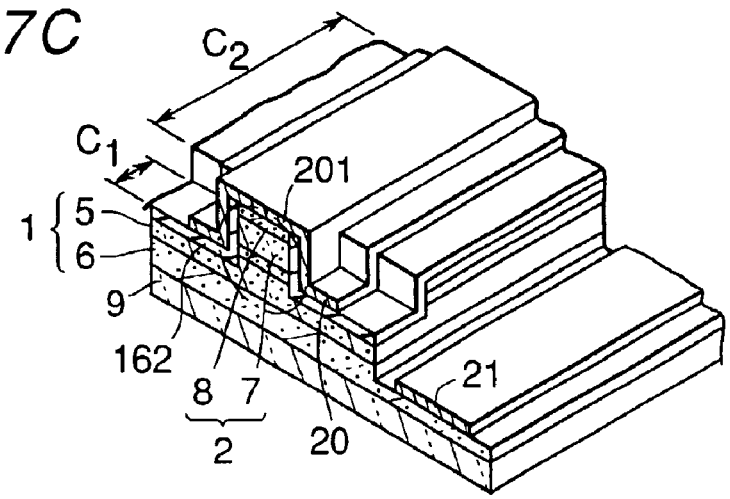
Figure 7D:
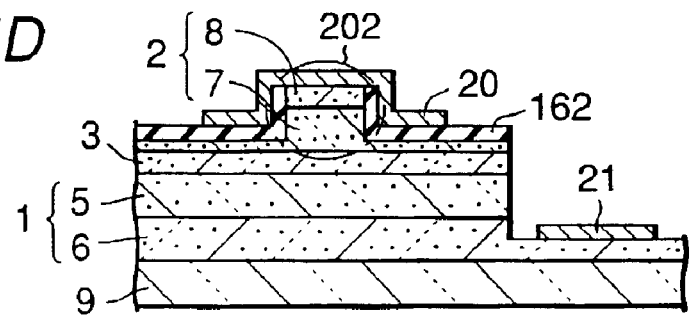
Figure 8:
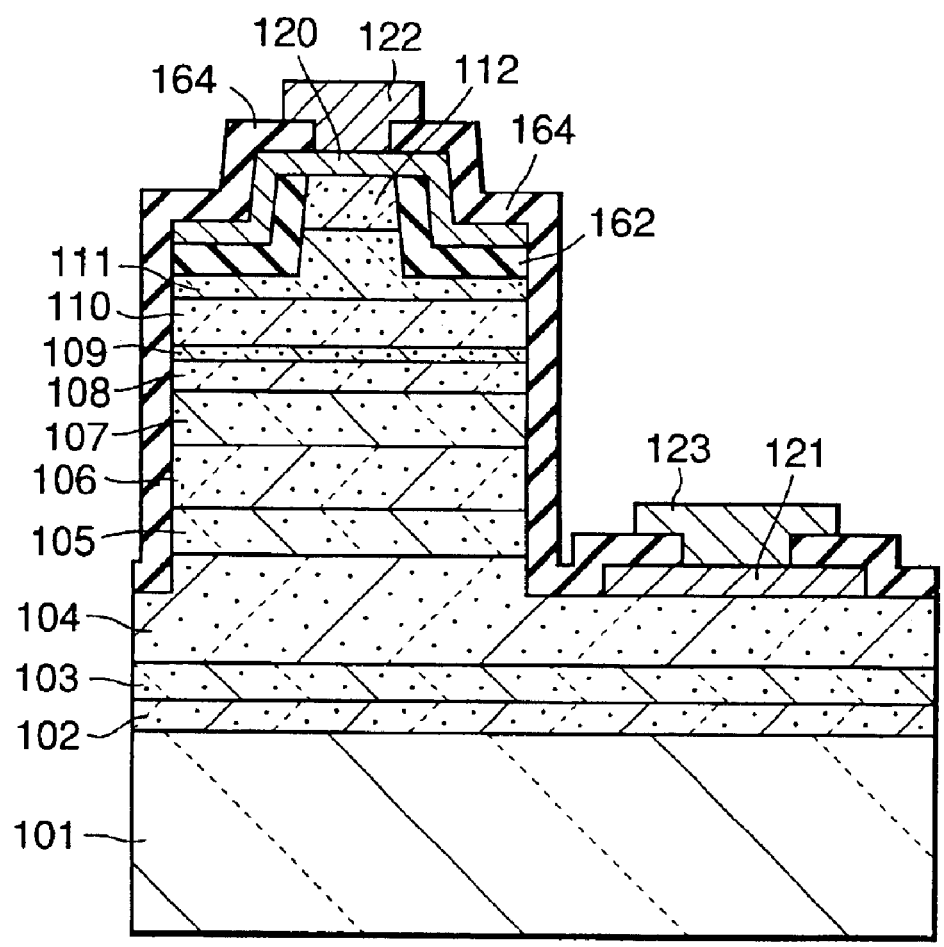
FIG. 8 is a schematic sectional view of the second waveguide region of the laser device according to the first embodiment of the present invention.
Figure 9:
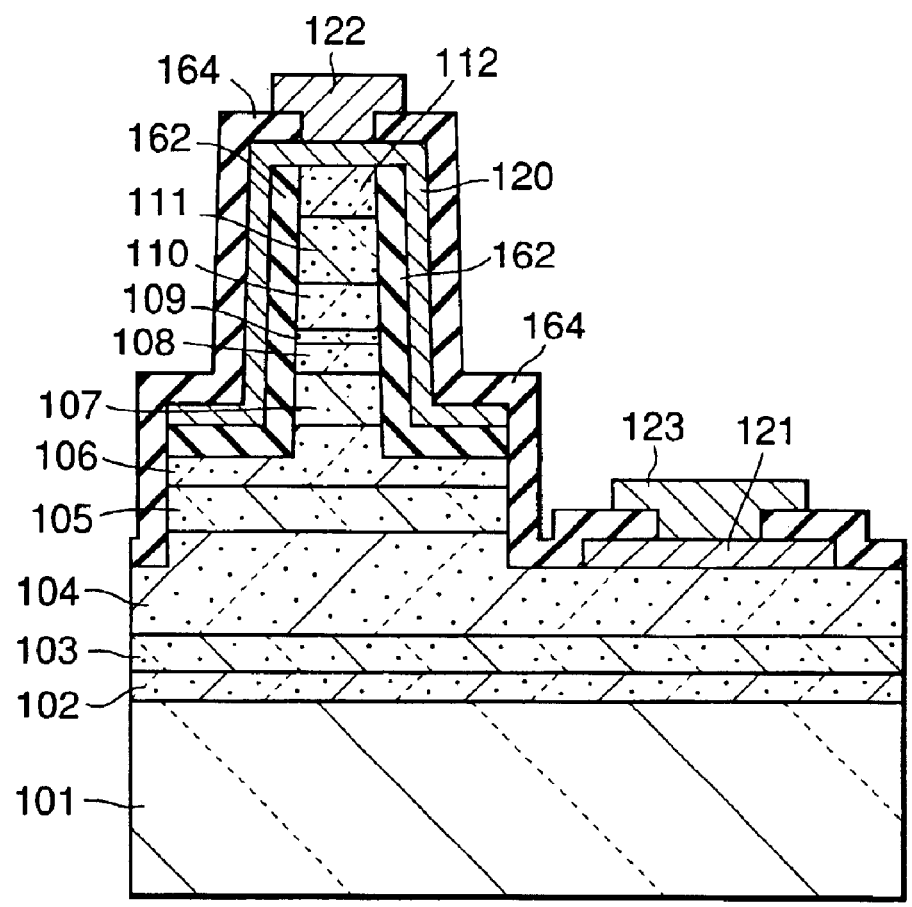
FIG. 9 is a schematic sectional view of the first waveguide region of the laser device according to the first embodiment of the present invention.

In case nitride semiconductor is used in the laser device of the present invention, it is preferable to provide a second protective film 162 as an insulation film as shown in FIGS. 7, 8, 9.

For the second protective film, a material other than $SiO_2$, preferably an oxide which includes at least one kind of element selected from among the group consisting of Ti, V, Zr, Nb, Hf and Ta, or at least one of SiN, BN, SiC and AlN is used and, among these, it is particularly preferable to use Zr or Hf, or BN, SiC. While some of these materials are slightly soluble to hydrofluoric acid, use of these materials as the insulation layer of the laser device will achieve reliability fairly higher than $SiO_2$ as a buried layer. In the case of a thin film made of an oxide which is formed in vapor phase such as PVD or CVD, since it is generally difficult for the element and oxygen to react stoichiometrically to form the oxide, reliability tends to be lower for the insulation of the thin film of oxide. In contrast, oxides of the element selected in the present invention formed by PVD or CVD, and BN, SiC or AlN have higher reliability of insulation property than Si oxide. Moreover, when an oxide having a refractive index lower than that of the nitride semiconductor (for example, one other than SiC) is selected, a buried layer of laser device can be favorably formed. Further, when the first protective film 161 is formed from Si oxide, since the Si oxide can be removed using hydrofluoric acid, the second protective film 162 having uniform thickness can be formed on the surface except for the top surface of the ridge as shown in FIG. 7C, by forming the first protective film 161 only on the top surface of the ridge as shown in FIG. 7B, forming the second protective film 162 continuously on the first protective film 161, the side faces of the ridge and the surfaces on both sides of the ridge (etching stopper layer), and selectively removing the first protective film 161.

Thickness of the second protective film is in a range from 500 Å to 1 μm, and preferably in a range from 1000 Å to 5000 Å. When the thickness is less than 500 Å, sufficient insulation cannot be achieved when forming the electrode. When thicker than 1 μm, uniformity of the protective film cannot be achieved and good insulation film cannot be obtained. When the thickness is in the preferred range described above, a uniform film having a favorable difference in refractive index from that of the ridge can be formed on the side face of the ridge.

The second protective film can also be formed by means of buried layer of nitride semiconductor. In the case of semi-insulating, i-type nitride semiconductor, type of conductivity opposite to that of the ridge of the waveguide region, for example in the second waveguide region $C_2$ of the first embodiment, a buried layer made of n-type nitride semiconductor can be used as the second protective film. As a specific example of buried layer, confinement of light in the transverse direction can be achieved by providing a difference in refractive index from the ridge by means of a nitride semiconductor layer which includes Al such as AlGaN or achieving the function of current blocking layer, and good optical property of the laser device can be achieved by providing a difference in the light absorption coefficient by means of a nitride semiconductor laser which includes In. When a layer other than semi-insulating, i-type layer is used for the buried layer, the second waveguide region may be a buried layer of the first conductivity type different from the second conductivity type. In the first ridge that constitutes the first waveguide region, on the other hand, since the layers of the first and second conductivity types are formed in stripe configuration on both sides of the active layer, a buried layer of the second conductivity type different from the first conductivity type is formed in the layer of the first conductivity type or in the regions on both sides of the layer of the first conductivity type and the active layer, while a buried layer of the first conductivity type different from the second conductivity type is formed in the layer of the second conductivity type or in the regions on both sides of the layer of the second conductivity type and the active layer. As described above, the buried layer may be formed in different constitutions in the first waveguide region and the second waveguide region. The buried layer is formed on a part of the stripe side face, or preferably over substantially the entire surface, similarly to the second protective film. Moreover, when the buried layer is formed on the side face of the ridge and the surface of the nitride semiconductor on both sides of the ridge, better light confinement effect and current pinching effect can be achieved. Such a constitution may also be employed as, after forming the buried layer, a layer of nitride semiconductor is formed on the buried layer and/or the stripe and ridges constituting the waveguide regions are disposed in the device.

Length of the resonator of the nitride semiconductor laser device of the present invention may be in a range from 400 to 900 μm, in which case the drive current can be decreased by controlling the reflectance of the mirrors on both ends.

[Manufacturing Method]

As described above, the nitride semiconductor laser device of the present invention can achieve good device characteristics. Further, the stripe waveguide region of the laser device of the present invention can be made with a high accuracy and high yield of production, by forming the stripes that make the first waveguide region $C_1$ and the second waveguide region $C_2$ in the process described below. The manufacturing method also makes it possible to manufacture the laser device having high reliability. The manufacturing method will now be described in detail below.

As shown in FIGS. 8 and 9, when manufacturing a device having a pair of positive and negative electrodes formed on the same side of different kind of substrate, in order to expose an n-type contact layer whereon the negative electrode is to be formed as shown in FIG. 7, etching is done to that depth followed by etching to form the stripe waveguide region.

(Method 1 for Forming the Stripe Ridge)

FIG. 5 is a schematic perspective view showing a part of a wafer whereon device structure is formed from nitride semiconductor, for explaining the process of forming the electrodes according to the present invention. FIG. 6 is a similar drawing for explaining another embodiment of the present invention. FIG. 7 shows a process after forming the second protective film, FIG. 7B showing sectional view of the second waveguide region $C_2$ in FIG. 7A and FIG. 7C showing sectional view of the second waveguide region $C_2$ in FIG. 7D. According to the manufacturing method of the present invention, as shown in FIG. 5A, after stacking the semiconductor layers that constitute the device structure, the first protective film 161 of stripe configuration is formed on a contact layer 8 in the layer of second conductivity type on the top layer.

The first protective film 161 may be made of any material as long as it has a difference from the etching rate of the nitride semiconductor, whether insulating or not. For example, Si oxide (including $SiO_2$), photoresist or the like is used, and such a material that is more soluble to an acid than the second protective film does is preferably used in order to differentiate the solubility against the second protective film which will be formed later. Hydrofluoric acid is preferably used for the acid, and accordingly Si oxide is preferably used as the material soluble to hydrofluoric acid. Stripe width (W) of the first protective film is controlled within a range from 1 μm to 3 μm. Stripe width of the first protective film 161 roughly corresponds to the stripe width of the ridge that constitutes the waveguide region.

Figure 5A:
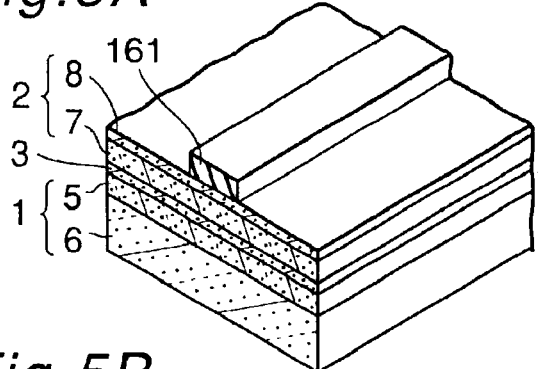
FIG. 5A through FIG. 5D are perspective views showing the process of forming the ridge of the laser device of the present invention.
Figure 5E:
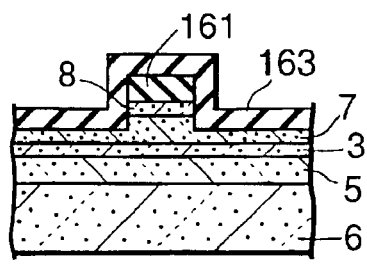
FIG. 5E is a sectional view of a portion where the second waveguide region of FIG. 5C is to be formed.
Figure 6A:
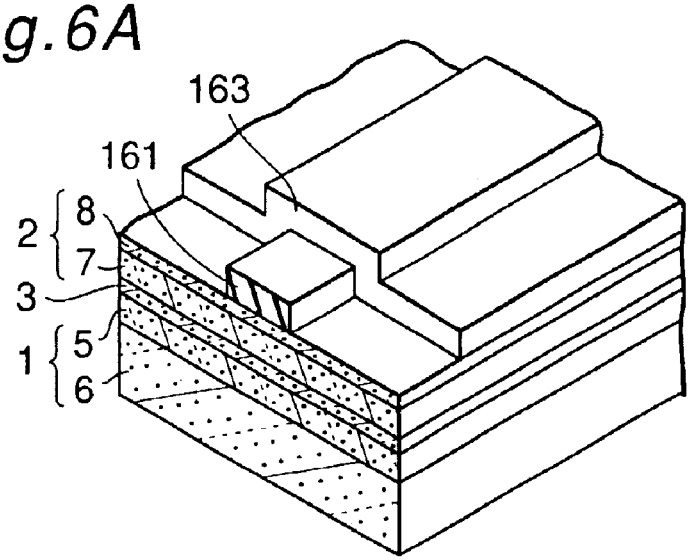
FIG. 6A through FIG. 6C are perspective views showing the process of forming the ridge of the laser device of the present invention by a method different from the method shown in FIG. 5A through FIG. 5D.
Figure 6B:
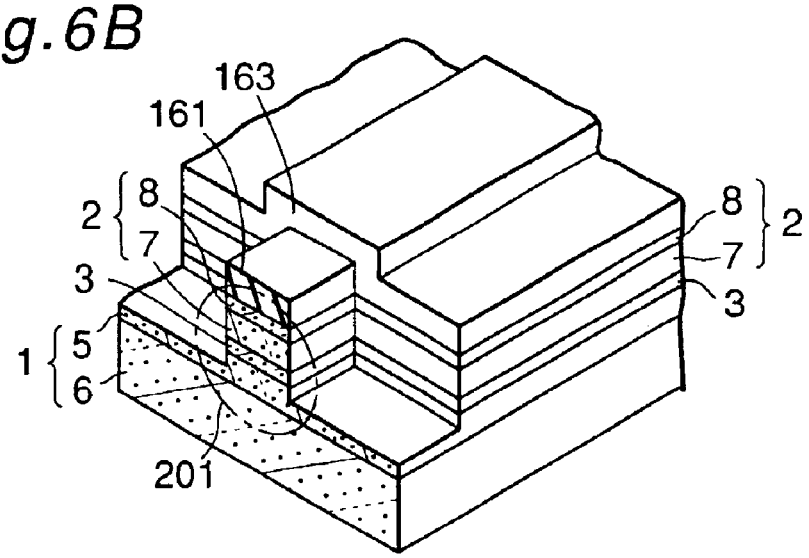
Figure 6C:
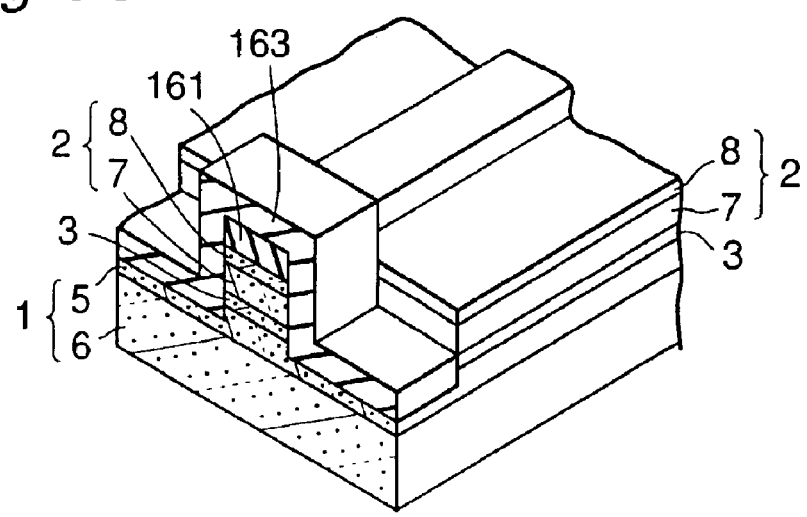

FIG. 5A shows the first protective film 161 being formed on the surface of the laminate. That is, the first protective film 161 having such a stripe configuration as shown in FIG. 5A is formed on the surface of the contact layer 8 by, after forming the second protective film over substantially the entire surface of the laminate, forming a mask of a desired shape on the surface of the first protective film by photolithography process.

Lift-off method may also be employed to form the first protective film 161 having such a stripe configuration as shown in FIG. 5A. That is, after forming a photoresist having slits formed in stripe configuration, the first protective film is formed over the entire surface of the photoresist, and the photoresist is removed by dissolving thereby leaving only the first protective film 161 which is in contact with the contact layer 8. Well-shaped stripes having substantially vertical end faces can be obtained by the etching process described above rather than by forming the first protective film of stripe configuration by the lift-off method.

Figure 5B:
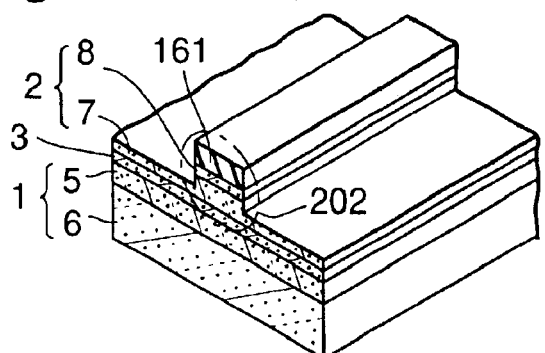
Figure 5F:
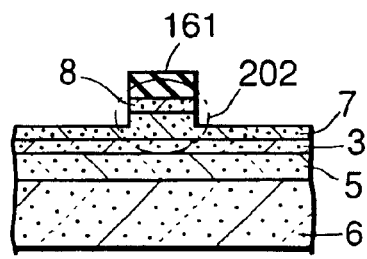
FIG. 5F is a perspective view of a portion where the second waveguide region of FIG. 5D is to be formed.

Then as shown in FIG. 5B, the first protective film 161 is used as the mask for etching from the contact layer 8 the portion where the first protective film 161 is not formed, thereby to form the stripe ridge according to the shape of the protective film directly below the first protective film 161. When etching, structure and characteristic of the laser device vary depending on the position to stop etching.

As the means for etching the layer formed from nitride semiconductor, dry etching is used such as RIE (reactive ion etching). For etching the first protective film made of Si oxide, it is preferable to use gas of fluorine compound such as $CF_4$. For etching the nitride semiconductor in the second process, use of gas of chlorine compound such as $Cl_2$, $CCl_4$ and $SiCl_4$ which are commonly used for the other Group III-V compound semiconductor makes the selectivity with respect to the Si oxide higher, and is therefore desirable.

Figure 5C:
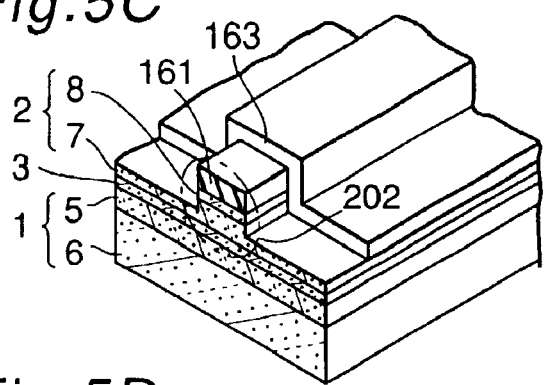
Figure 5D:
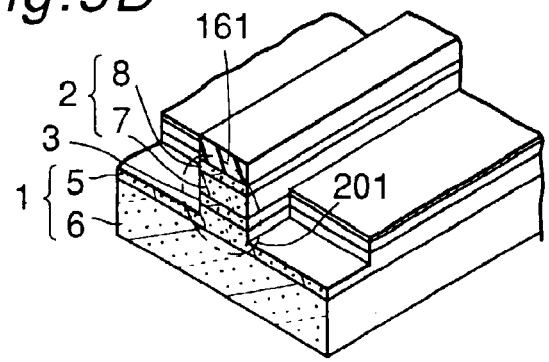

Then as shown in FIG. 5C, a third protective film 163 is formed so as to cover a part of the stripe ridge. For the third protective film 163, known resist film which has resistance to dry etching can be used, such as light-hardening resin. At this time, the stripe ridge covered by the third protective film 163 becomes the second ridge 202 for constituting the second waveguide region $C_2$, and the first ridge 201 which constitutes the first waveguide region $C_1$ is formed in a region not covered by third protective film. The third protective film 163 and the first protective film 161 formed as described above are used to etch the laminate, where the masks are not formed, to such a depth as to reach the cladding layer, thereby to form the stripe ridges (first ridge) of different depths.

Then as shown in FIG. 7A, the second protective film 162 of an insulating material different from that of the first protective film 161 is formed on the side faces of the stripe ridge and on the surfaces of the layers which have been exposed by etching (cladding layers 5, 7 in FIG. 7). The first protective film 161 is made of a material different from that of the second protective film 162, so that the first protective film 161 and the second protective film 162 are selectively etching. As a result, when only the first protective film 161 is removed by, for example, hydrofluoric acid, the second protective film 162 can be formed continuously over the surfaces of the cladding layers 5, 7 (the surfaces of the nitride semiconductor which have been exposed by etching) and the side faces of the ridge with the top surface of the ridge being opened as shown in FIG. 7B. By forming the second protective film 162 continuously as described above, high insulation property can be maintained. In addition, when the second protective film 162 is formed continuously over the first protective film 161, the film can be formed with uniform thickness on the cladding layers 5, 7, and therefore current concentration due to uneven film thickness does not occur. Since the etching is stopped amid the cladding layers 5, 7, the second protective film 162 is formed below the surfaces of the cladding layers 5, 7 (top surfaces which are exposed). However, the second protective film is formed on the layer where the etching was stopped when the etching is stopped below the cladding layers 5, 7, as a matter of fact.

In the next process, the first protective film 161 is removed by lift-off as shown in FIG. 7B. Then the electrode is formed on the second protective film 162 and the contact layer 8 so as to electrically contact the contact layer 8. According to the present invention, since the second protective film having the striped openings is formed first on the ridge, it is not necessary to form the electrode only on the contact layer of narrow stripe width, and it is made possible to form the electrode of a large area which continues from the contact layer that is exposed through the opening to the second insulation film. This makes it possible to form the electrode combining the electrode for ohmic contact and the electrode for bonding together, by selecting the electrode material that combines the function of ohmic contact.

When forming the stripe waveguide region in the nitride semiconductor laser device, dry etching is employed because it is difficult to etch by the wet process. Since selectivity between the first protective film and the nitride semiconductor is important in the dry etching process, $SiO_2$ is used for the first protective film. However, sufficient insulation cannot be achieved when $SiO_2$ is used also in the second protective film formed on the top surface of the layer where etching has been stopped, and the material is the same as that of the first protective film, it becomes difficult to remove the protective film only. For this reason, a material other than $SiO_2$ is used for the second protective film thereby ensuring the selectivity with respect to the first protective film in the present invention. Also because the nitride semiconductor is not etched after forming the second protective film, difference in the etching rate between the second protective film and the nitride semiconductor makes no problem.

(Method 2 for Forming the Stripe Ridge)

FIG. 16 is a schematic perspective view showing a part of a wafer whereon device structure is formed from nitride semiconductor, for explaining the process of forming the semiconductor laser according to the present invention. Processes of this method are substantially similar to the processes of the method 1, although the end faces of the resonator are formed at the same time the n-type contact layer is exposed for forming the negative electrode by etching in the case of this method. Namely, the order of forming different portions is different from the method 1. In the method 2, first the n-type contact layer is exposed (FIG. 16A). At this time, the end faces of the resonator are formed at the same time. Then the stripe ridge, the first and second waveguide regions and the electrode are formed similarly to the method 1 (FIG. 16B). By forming the end faces of the resonator by etching first as described above, the invention can also be applied to such a case as good end faces of the resonator cannot be obtained by cleaving.

In the laser device of the present invention, as described above, the stripe ridge 202 for constituting the first waveguide region $C_1$ and the second waveguide region $C_2$ can be efficiently formed, and the electrode can be formed on the surface of the ridge of the laminate.

(Etching Means)

According to the manufacturing method of the present invention, when dry etching is used such as RIE (reactive ion etching) as the means for etching the layer formed from nitride semiconductor, it is preferable to use gas of fluorine compound such as $CF_4$ for etching the first protective film made of Si oxide which is frequently used in the first process. For etching the nitride semiconductor in the second process, use of gas of chlorine compound such as $Cl_2$, $CCl_4$ and $SiCl_4$ which are commonly used for the other Group III-V compound semiconductor makes the selectivity with respect to the Si oxide higher, and is therefore desirable.

(Chip Formation)

Figure 17A:
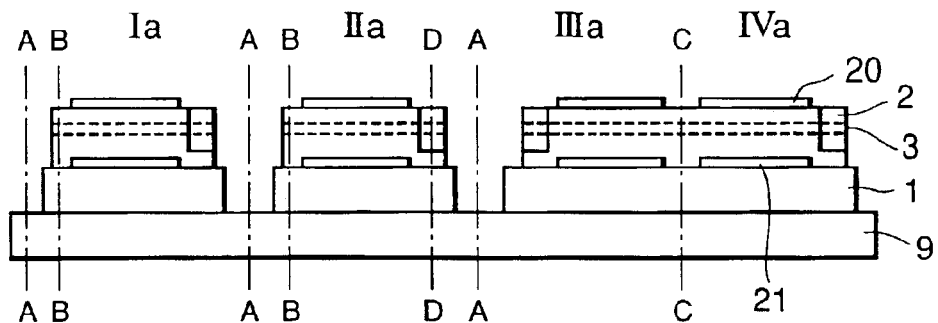
FIG. 17A and FIG. 17B are schematic sectional views showing the cutting position according to the method for manufacturing the laser device of the present invention.
Figure 17B:
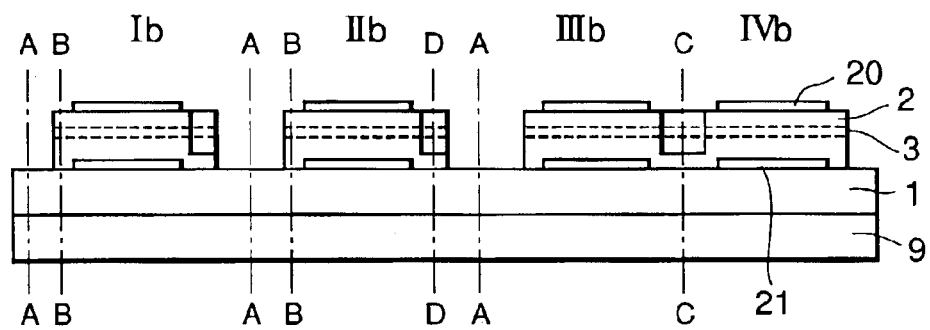

FIG. 17 is a schematic sectional view showing the cutting position when making chips out of the laminate formed on the wafer as described previously. FIG. 17A shows only the substrate, and FIG. 17B shows a case of dividing the substrate and the n-type layer. Regions each including a pair of electrodes formed therein are dealt with as units and are referred to as I, II, III and IV from left to right as shown in the drawing. Ia, IIa and IVa in FIG. 17A are arranged so that the first waveguide region is directed to the right, and IIIa is directed opposite. Ib, IIb and IIIb in FIG. 17B are arranged so that the first waveguide region is directed to the right, and IVb is directed opposite. Such an arrangement of the units before division may be selected as required.

When divided along line A—A, end faces of the resonator can be left as formed by etching. In units I and II, an end face on the light reflector side of the resonator is the cleaved facet when divided along line B—B after being divided along line A—A. In II, the end face on the light emitting side of the resonator is also the cleaved facet when divided along line D—D. When divided along line C—C, end faces on the light reflector side of the resonator in IIIa and IVa are formed as cleaved facets at the same time. Similarly, when divided along line E—E, end faces on the light emitting side of the resonator in IIIb and IVb are formed as cleaved facets at the same time. Thus the end face of the device and resonator end faces can be formed as etched surface or cleaved surface depending on the cut-off position.

Figure 16A:
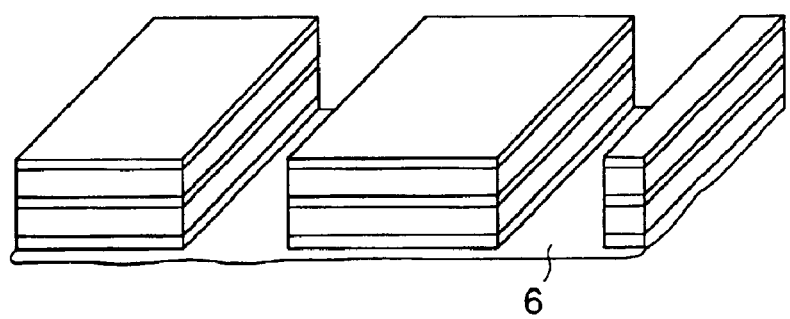
FIG. 16A through FIG. 16D are perspective views showing the method for manufacturing the laser device of the present invention by using devices formed on a wafer.
Figure 16B:
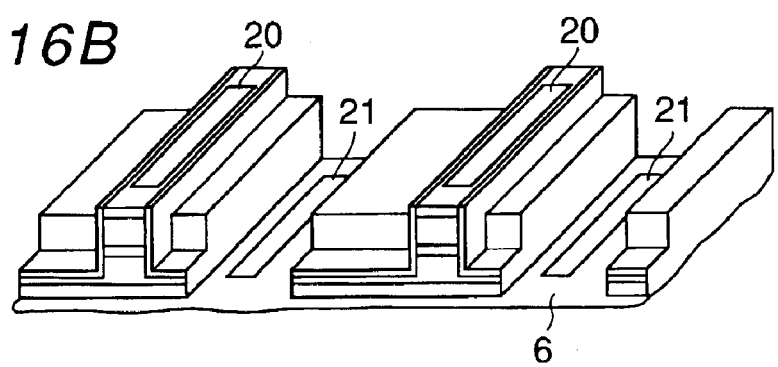
Figure 16C:
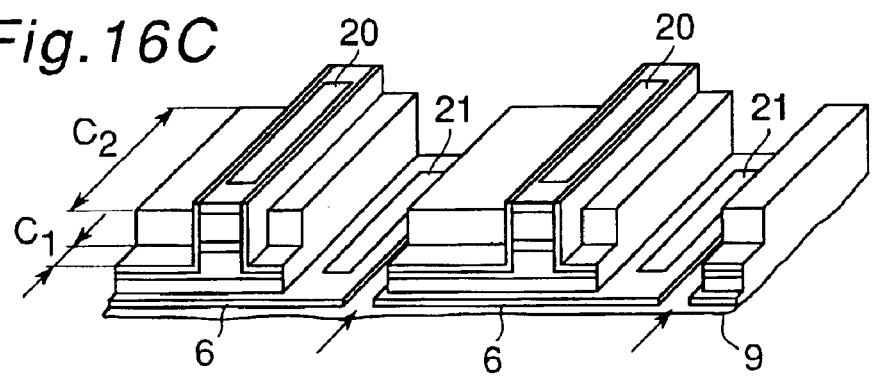
Figure 16D:
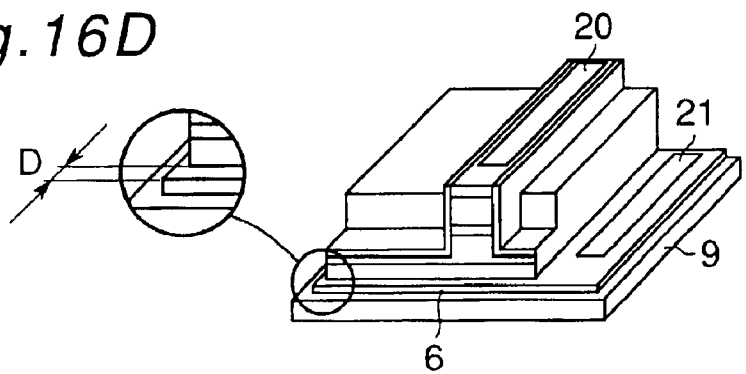

In order to achieve such an arrangement as only the substrate exists between the resonator end face of Ia and the resonator end face of IIb as between Ia and IIa shown in FIG. 17A, the work whereon the resonator end faces have been formed by etching as shown in FIG. 16B is further etched down to the substrate. The reason for etching down to the substrate is to prevent the semiconductor layer from cracking when dividing. In case the substrate is exposed in a single etching process by skipping the step shown in FIG. 16A, the surface near the active layer which has been exposed by etching earlier becomes roughened due to long duration of etching, thus making it difficult to obtain good resonator end face. When the etching process is divided into two steps, first etching to the n-type layer as shown in FIG. 16A and then etching down to the substrate, good resonator end faces can be formed and division becomes easier. FIG. 16D shows the work shown in FIG. 16C being cut off at the position indicated by the arrow. By applying etching in two steps as described above, protrusion such as D in the drawing is formed. When etching down to the substrate, it is necessary to reduce the length of this protrusion D to the light emitting direction. This is because a large width D (length of protrusion) blocks the light emitted from the light emitting face and makes it difficult to obtain good F.F.P. There will be no problem when D is small at least at the end face on the light emitting side.

(Reflector Film)

Figure 18:
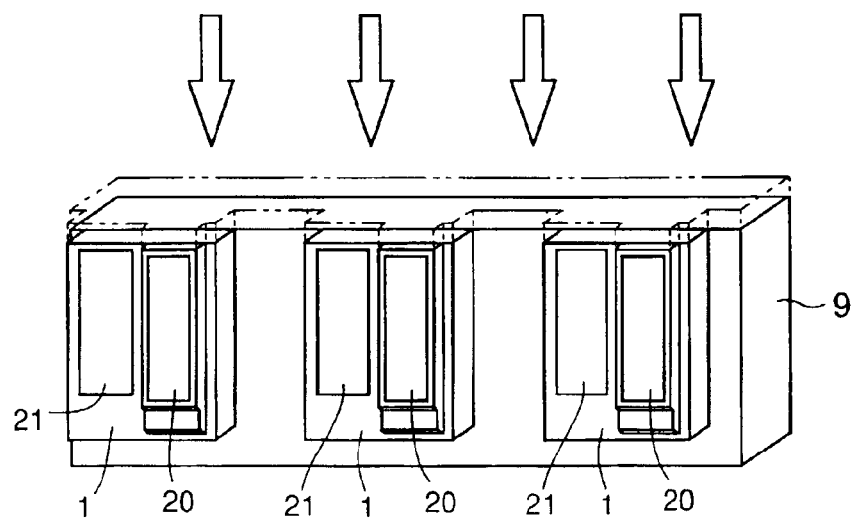
FIG. 18 is a schematic diagram showing the process of forming the reflector film according to the method for manufacturing the laser device of the present invention.

FIG. 18 schematically shows the method of forming a reflector film on the resonator end face. By disposing semiconductor which is divided into bar shape so that the end face on the light reflecting side or the end face on the light emitting side opposes the material of the reflector film, as shown in FIG. 18, the reflector film is formed by sputtering or the like. By forming the reflector film by sputtering while dividing the semiconductor into bar shape and disposing the cut-off face to oppose the material of the reflector film, high-quality reflector film which has uniform thickness and is less likely to deteriorate can be formed even when the film is formed in multi-layered structure. Such a reflector film is more effective when used in a device which is required to have a high output power and, particularly when formed in multi-layered structure, the reflector film bearable to high output power can be made. The reflector film can be formed so as to extend to the resonator end face which is a side face even by sputtering from above the electrode. In this case, however, such an advantage as the process to form into bar shape and directing the end face upward can be eliminated, although uniform film cannot be obtained particularly in the case of in multi-layered film since the film is formed from sideways onto the end face and therefore somewhat lower film quality results. Such a reflector film may be provided on both the light reflecting end face and the light emitting end face, or only on one end face and different materials may be used.

According to the present invention, there is no limitation to the other device structure such as the active layer and the cladding layer, and various layer structures can be used. As a specific device structure, for example, the device structure shown in the embodiment to be described later may be used. Also there is no limitation to the electrode, and various constitutions of electrode can be used. Composition of the nitride semiconductors used in various layers of the laser device is not restricted and nitride semiconductors represented by the formula $In_bAl_cGa_{1-b-c}N$ ($0 \leq b$, $0 \leq d$, $b+d<1$) can be used.

According to the present invention, any known methods of growing nitride semiconductor such as MOVPE, MOCVD (metalorganic chemical vapor phase deposition), HVPE (hallide vapor phase epitaxy) and MBE (molecular beam epitaxy).

Embodiments

Now embodiment of the present invention will be described below.

While the following embodiments deal with laser devices made of nitride semiconductor, the laser device of the present invention is not limited to this constitution and the technology of the present invention can be applied to various semiconductors.

Embodiment 1

A laser device of the first embodiment will be described below. Specifically, the laser device comprising the second waveguide region $C_2$ which has the sectional structure shown in FIG. 8 and the first waveguide region $C_1$ which has the sectional structure shown in FIG. 9 is made as the first embodiment.

While a substrate made of sapphire, namely a material different from the nitride semiconductor is used in the first embodiment, a substrate made of nitride semiconductor such as GaN substrate may also be used. As the substrate of different material, an insulating substrate such as sapphire and spinel ($MgAl_2O_4$) each having the principal plane in either the C plane, R plane or A plane, SiC (including 6H, 4H and 3C), ZnS, ZnO, GaAs, Si, or an oxide which can be lattice-matched with the nitride semiconductor can be used as long as the nitride semiconductor can be grown on the substrate. As the substrate of different material, sapphire and spinel are preferably used. The substrate of different material may have a plane inclined from the low index plane which is commonly used (off-angle), in which case the base layer made of gallium nitride can be grown with good crystallinity by using a substrate which has stepwise off-angle configuration.

Also when the substrate of different material is used, after growing the base layer made of the nitride semiconductor on the substrate, the substrate of different material is removed by polishing or other process to leave only the base layer before forming the device structure, and then the device structure may be formed by using the base layer as the single substrate of the nitride semiconductor, or the substrate of different material may also be removed after forming the device structure.

In case the substrate of different material is used as shown in FIG. 8, device structure made of good nitride semiconductor can be formed by forming the device structure after forming the buffer layer and the base layer thereon. FIG. 8 is a sectional view showing the device structure in the second waveguide region $C_2$, and FIG. 9 is a sectional view showing the device structure in the first waveguide region $C_1$.

(Buffer Layer 102)

In the first embodiment, first, a substrate 101 of different material made of sapphire with the principal plane lying in the C plane having diameter of 2 inches is set in a MOVPE reaction vessel, temperature is set to 500° C., and a buffer layer made of GaN is formed to a thickness of 200 Å by using trimethyl gallium (TMG) and ammonia ($NH_3$).

(Base Layer 103)

After growing the buffer layer 102, temperature is set to 1050° C. and a nitride semiconductor layer 103 made of undoped GaN is grown to a thickness of 4 μm by using TMG and ammonia. This layer is formed as the base layer (substrate for film growth) for the constitution of the device. The base layer may also be formed from nitride semiconductor by ELOG (Epitaxially Laterally Overgrowth), which makes it possible to grow the nitride semiconductor with good crystallinity. ELOG refers collectively to growing methods accompanied by lateral growth in which, for example, after growing a nitride semiconductor layer on a substrate of different material, the surface is covered by a protective film on which it is difficult to grow the nitride semiconductor formed thereon in the configuration of stripes at constant intervals, and nitride semiconductor is grown newly from the nitride semiconductor surface exposed through the slits of the protective film, thereby covering the entire substrate with the nitride semiconductor. That is, when a masked region where a mask is formed and a non-masked region where the nitride semiconductor is exposed are formed alternately and nitride semiconductor is grown again from the surface of the nitride semiconductor exposed through the non-masked region, the layer grows first in the direction of thickness but eventually grows also in the lateral direction as the growth proceeds so as to cover the masked region, thereby to cover the entire substrate.

The ELOG growth processes also include such a process as an opening is formed through which the substrate surface is exposed in the nitride semiconductor layer which has been grown first on the substrate of different material, and nitride semiconductor is grown from the nitride semiconductor located at the side face of the opening sideways, thereby forming the film.

According to the present invention, these various variations of the ELOG growth method can be employed. When nitride semiconductor is grown by using the ELOG growth method, the nitride semiconductor formed by the lateral growth has good crystallinity and therefore a nitride semiconductor layer having good overall crystallinity can be obtained.

Then the following layers which constitute the device structure are stacked on the base layer made of nitride semiconductor.

(n-type Contact Layer 104)

First, an n-type contact layer 3 made of GaN doped with Si concentration of $1\times10^{18}/cm^3$ is formed to a thickness of 4.5 μm at a temperature of 1050° C. on the nitride semiconductor substrate (base layer) 103 by using TMG, ammonia, and silane gas used as an impurity gas.

(Crack Preventing Layer 105)

Then a crack preventing layer 105 made of $In_{0.06}Ga_{0.94}N$ is formed to a thickness of 0.15 μm at a temperature of 800° C. by using TMG, TMI (trimethyl indium), and ammonia. The crack preventing layer may be omitted.

(n-type Cladding Layer 106)

After growing layer A made of undoped AlGaN to a thickness of 25 Å is grown at a temperature of 1050° C. by using TMA (trimethyl aluminum), TMG and ammonia as the stock material gas, supply of TMA is stopped and silane gas is used as the impurity gas, and layer B made of GaN doped with Si concentration of $5\times10^{18}/cm^3$ is formed to a thickness of 25 Å. This operation is repeated 160 times to stack the layer A and layer B to form the n-type cladding layer 106 made in multi-layered film (super lattice structure) having a total thickness of 8000 Å. At this time, a difference in the refractive index sufficient for the cladding layer to function can be provided when the proportion of Al of the undoped AlGaN is in a range from 0.05 to 0.3.

(n-type Optical Guide Layer 107)

Then at a similar temperature, an n-type optical guide layer 107 made of undoped GaN is formed to a thickness of 0.1 μm by using TMG and ammonia as the stock material gas. The n-type optical guide layer 107 may be doped with an n-type impurity.

(Active Layer 108)

Then by setting the temperature to 800° C., a barrier layer made of $In_{0.05}Ga_{0.95}N$ doped with Si in a concentration of $5\times10^{18}/cm^3$ to a thickness of 100 Å by using TMI (trimethyl indium), TMG and ammonia as the stock material gas and silane gas as the impurity gas. Then the supply of silane gas is stopped and a well layer made of undoped $In_{0.1}Ga_{0.9}N$ is formed to a thickness of 50 Å. This operation is repeated three times thereby to form the active layer 108 of multiple quantum well structure (MQW) having total thickness of 550 Å with the last layer being the barrier layer.

(p-type Electron Confinement Layer 109)

Then at a similar temperature, a p-type electron confinement layer 109 made of AlGaN doped with Mg in a concentration of $1\times10^{19}/cm^3$ is formed to a thickness of 100 Å by using TMA, TMG and ammonia as the stock material gas and $Cp_2Mg$ (cyclopentadienyl magnesium) as the impurity gas. This layer may not be provided, though would function as electron confinement layer and help decrease the threshold when provided.

(p-type Optical Guide Layer 110)

Then by setting the temperature to 1050° C., a p-type optical guide layer 110 made of undoped GaN is formed to a thickness of 750 Å by using TMG and ammonia as the stock material gas.

While the p-type optical guide layer 110 is grown as an undoped layer, diffusion of Mg from the p-type electron confinement layer 109 increases the Mg concentration to $5\times10^{16}/cm^3$ and turns the layer p-type. Alternatively, this layer may be intentionally doped with Mg while growing.

(p-type Cladding Layer 111)

Then a layer of undoped $Al_{0.16}Ga_{0.84}N$ is formed to a thickness of 25 Å at 1050° C., then supply of TMA is stopped and a layer of Mg-doped GaN is formed to a thickness of 25 Å by using $Cp_2Mg$. This operation is repeated to form the p-type cladding layer 111 constituted from super lattice structure of total thickness of 0.6 μm. When the p-type cladding layer is formed in super lattice structure consisting of nitride semiconductor layers of different band gap energy with at least one thereof including Al being stacked one on another, crystallinity tends to be improved by doping one of the layers more heavily than the other, in the so-called modulated doping. In the present invention, however, both layers may be doped similarly. The cladding layer is made in super lattice structure consisting of nitride semiconductor layers which include Al, preferably $Al_xGa_{1-x}N$ (0<X<1), more preferably super lattice structure consisting of GaN and AlGaN stacked one on another. Since the p-type cladding layer 111 formed in the super lattice structure increases the proportion of Al in the entire cladding layer, refractive index of the cladding layer can be decreased. Also because the band gap energy can be increased, it is very effective in reducing the threshold. Moreover, since pits generated in the cladding layer can be reduced by the super lattice structure compared to a case without super lattice structure, occurrence of short-circuiting is also reduced.

(p-type Contact Layer 112)

Last, at a temperature of 1050° C., a p-type contact layer 112 made of p-type GaN doped with Mg in a concentration of $1\times10^{20}/cm^3$ is formed to a thickness of 150 Å on the p-type cladding layer 111. The p-type contact layer may be formed from p-type $In_xAl_yGa_{1-x-y}N$ ($0\leq X$, $0\leq Y$, $X+Y\leq 1$), and preferably from Mg-doped GaN which achieves the best ohmic contact with the p-type electrode 20. Since the contact layer 112 is the layer where the electrode is to be formed, it is desirable to have a high carrier concentration of $1\times10^{17}/cm^3$ or higher. When the concentration is lower than $1\times10^{17}/cm^3$, it becomes difficult to achieve satisfactory ohmic contact with the electrode. Forming the contact layer in a composition of GaN makes it easier to achieve satisfactory ohmic contact with the electrode. After the reaction has finished, the wafer is annealed in nitrogen atmosphere at 700° C. in the reaction vessel thereby to further decrease the electrical resistance of the p-type layer.

After forming the nitride semiconductor layers one on another as described above, the wafer is taken out of the reaction vessel. Then a protective film of $SiO_2$ is formed on the surface of the top-most p-type contact layer, and the surface of the n-type contact layer 104 whereon the n-type electrode is to be formed is exposed as shown in FIG. 8 by etching with $SiCl_4$ gas in the RIE (reactive ion etching) process. For the purpose of deep etching of the nitride semiconductor, $SiO_2$ is best suited as the protective film. At the same time the n-type contact layer 104 is exposed, end faces of the active layer which would become the resonance end face may also be exposed thereby making the etched end face serve as the resonance end face.

Now a method for forming the first waveguide region $C_1$ and the second waveguide region $C_2$ as the stripe waveguide region will be described in detail below. First, a first protective film having thickness of 0.5 μm is formed from Si oxide (mainly $SiO_2$) over substantially the entire surface of the top-most p-type contact layer (upper contact layer) 8 by means of a PDP apparatus. Then the first protective film 161 is formed by patterning (refer to FIG. 5A used in the description of the embodiment). Patterning of the first protective film 161 is carried out by means of photolithography process and the RIE (reactive ion etching) apparatus which employs $SiF_4$ gas. Then by using the first protective film 161 as the mask, a part of the p-type contact layer 112 and the p-type cladding layer 111 is removed so that the p-type cladding layer 111 remains with a small thickness on both sides of the mask, thereby forming striped ridges over the active layer 3 (refer to FIG. 5B used in the description of the embodiment). This results in the second ridge 202 which constitutes the second waveguide region $C_2$ being formed. At this time, the second ridge is formed by etching a part of the p-type contact layer 112 and the p-type cladding layer 111, so that the p-type cladding layer 111 is etched to a depth of 0.01 μm.

After forming the striped second ridge, a photoresist film is formed as the third protective film 163 except for a part of the second ridge (the portion which constitutes the first waveguide region) (refer to FIG. 5C used in the description of the embodiment). The first protective film 161 remains on the top surface of the ridge in the portion where the second waveguide region is to be formed and on the top surface of the ridge in the portion where the first waveguide region is to be formed.

Then after transferring to the RIE (reactive ion etching) apparatus, the third protective film 163 and the first protective film 161 are used as the masks to etch on both sides of the first protective film 161 in the portion where the first waveguide region is to be formed to such a depth as the n-type cladding layer 106 is exposed by using $SiF_4$ gas, thereby to form the first ridge of stripe configuration which constitutes the first waveguide region $C_1$. At this time, the first ridge formed in the stripe configuration is formed by etching the n-type cladding layer 106 on both sides of the first ridge to such a depth as the thickness becomes 0.2 μm.

The wafer having the first waveguide region $C_1$ and the second waveguide region $C_2$ formed thereon is then transferred to the PVD apparatus, where the second protective film 162 made of Zr oxide (mainly $ZrO_2$) with a thickness of 0.5 μm continuously on the surface of the first protective film 161, on the side faces of the first and second ridges, on the p-type cladding layer 111 which is exposed by etching and on the n-type cladding layer 106 (refer to FIG. 7A used in the description of the embodiment).

After forming the second protective film 162, the wafer is subjected to heat treatment at 600° C. When the second protective film is formed from a material other than $SiO_2$, it is preferable to apply heat treatment at a temperature not lower than 300° C., preferably 400° C. or higher but below the decomposition temperature of the nitride semiconductor (1200° C.) after forming the second protective film, which makes the second protective film less soluble to the material (hydrofluoric acid) which dissolves the first protective film.

Then the wafer is dipped in hydrofluoric acid to remove the first protective film 161 (lift-off process). Thus the first protective film 161 provided on the p-type contact layer 112 is removed thereby exposing the p-type contact layer 112. The second protective film 162 is formed on the side faces of the first ridge 201 and the second ridge 202 which are formed in stripes on the first waveguide region $C_1$ and the second waveguide region $C_2$, and on the surface located on both sides of the ridge continuing thereto (the surface of the p-type cladding layer 111 located on both side of the second ridge and the surface of the n-type cladding layer located on both side of the first ridge) by the process described above (refer to FIG. 7C used in the description of the embodiment).

After the first protective film 161 provided on the p-type contact layer 112 is removed as described above, a p-type electrode 120 made of Ni/Au is formed on the surface of the exposed p-type contact layer making ohmic contact therewith. The p-type electrode 120 is formed with stripe width of 100 μm over the second protective film 162 as shown in FIG. 8. At this time, the p-type electrode 120 is formed only in the first waveguide region $C_1$ and the second waveguide region $C_2$ in the direction of stripe in the first embodiment. In the first embodiment, the p-type electrode 120 is formed to such a length that does not reach both ends of the second waveguide region $C_2$. After forming the second protective film 162, an n-type electrode 21 made of Ti/Al is formed in a direction parallel to the stripe on the n-type contact layer 104 which has been already exposed.

Then the region where lead-out electrodes for the p-type and n-type electrodes are to be formed is masked, and a multi-layered dielectric film 164 made of $SiO_2$ and $TiO_2$ are formed. With the mask being removed, apertures for exposing the p-type and n-type electrodes are formed in the multi-layered dielectric film 164. Through the apertures, the lead-out electrodes 122, 123 made of Ni—Ti—Au (1000 Å-1000 Å-8000 Å) are formed on the p-type and n-type electrodes. In the first embodiment, the active layer 108 in the second waveguide region $C_2$ is formed with a width of 200 μm (width in the direction perpendicular to the resonator direction) The guide layer is also formed with a similar width.

After forming the p-type and n-type electrodes, the resonance end faces are formed on the ends of the first waveguide region $C_1$ and the second waveguide region $C_2$ by etching further till the substrate is exposed.

In the laser device of the first embodiment, the resonator was formed with total length of 650 μm and the first waveguide region $C_1$ was formed with total length of 5 μm including one of the end faces of the resonator. Thus the second waveguide region $C_2$ has total length of 645 μm including the other end face. On the end faces of the resonator which are formed by etching, the multi-layered dielectric film made of $SiO_2$ and $TiO_2$ was formed. Then sapphire substrate of the wafer is polished to a thickness of 70 μm and is divided from the substrate side into bar shape with the wafer of bar shape further divided into individual devices, thereby to obtain the laser devices.

While the resonance end face is formed by forming the multi-layered dielectric film on the etched surface in the first embodiment, the wafer may be divided into bar shape along (11-00) M surface which is cleaved surface of GaN to use the surface as the resonance end face.

With the laser device of the first embodiment fabricated as described above, continuous oscillation at wavelength 405 nm with an output power of 30 mW was confirmed with threshold of 2.0 $kA/cm^2$ at room temperature. Also good beam of F.F.P. was obtained with aspect ratio of 1.5, indicating satisfactory beam characteristics for the light source of an optical disk system. The excellent characteristics are achieved through such features of the present invention that laser beam of desired optical characteristics can be emitted by adjusting the width of the ridge of the first waveguide region $C_1$ on the light emitting side regardless of the stripe width of the second waveguide region $C_2$ which functions mainly as a gain region. Also the laser device of the first embodiment does not experience a shift in the transverse mode in the optical output range from 5 to 30 mW, and therefore has favorable characteristic suitable for reading and writing light source of an optical disk system. In addition, the laser device having good performance when driven with 30 mW comparable to the conventional refractive-index guided laser device.

Also in the first embodiment, the p-type electrode may be provided over a length that covers the first waveguide region $C_1$ as shown in FIG. 7C. With this constitution, too, the laser device having excellent beam characteristics and long service life can be made.

[Embodiment 2]

The laser device is fabricated similarly to the first embodiment except for the length of the first waveguide region $C_1$ which is set to 1 μm. In order to form the first waveguide region $C_1$ with such a small length, the first ridge of stripe shape is formed longer than the final length of the resonator (for example, several tens to about 100 μm) and then the resonance end face is formed by etching or dividing the substrate at such a position as the desired length of the first waveguide region $C_1$ is obtained. As a result, it becomes more difficult to form the second ridge 201 with stable shape than in the case of the first embodiment, although the transverse oscillation mode can be well controlled even with this length. Also shorter length of the first waveguide region improves the device life slightly over the first embodiment.

[Embodiment 3]

The laser device of the third embodiment is constituted similarly to the first embodiment except for forming the first waveguide regions $C_1$ having length of 5 μm at both ends thereof (refer to FIG. 4B). That is, the laser device of the third embodiment has the second waveguide region $C_2$ located at the center and the first waveguide regions $C_1$ located on both sides of the former, while the first waveguide region $C_1$ includes the resonator end face. The laser device of the third embodiment having such a constitution has both F.F.P. and aspect ration of the beam similar to those of the first embodiment.

[Embodiment 4]

The laser device is constituted similarly to the first embodiment except that the second ridge 202 provided to constitute the second waveguide region $C_2$ is formed by etching to leave the p-type guide layer having a thickness of 500 Å on both sides of the second ridge. While laser device thus obtained has lower threshold than that of the first embodiment, beam characteristics similar to those of the first embodiment are obtained.

[Embodiment 5]

The laser device of the fifth embodiment is constituted similarly to the first embodiment except for providing a slant surface between the first waveguide region $C_1$ and the second waveguide region $C_2$ (refer to FIG. 4A) Specifically, in the fifth embodiment, in the boundary between the first waveguide region $C_1$ and the second waveguide region $C_2$, the sectional surfaces formed by etching between the surface of the n-type cladding layer 106 located on both sides of the first ridge and the surface of the p-type cladding layer 111 located on both sides of the second ridge is inclined to 90° with respect to the surface of the n-type cladding layer 106.

Though the laser device manufactured as described above may be subjected to variations in the device characteristics compared to the first embodiment, the effect of the present invention that goof F.F.P. is obtained and the reliability is improved can be achieved.

[Embodiment 6]

The laser device of the sixth embodiment is constituted similarly to the first embodiment except for providing the third waveguide region $C_3$ between the first waveguide region $C_1$ and the second waveguide region $C_2$ as shown in FIG. 13. Specifically, in the laser device of the sixth embodiment, after the second ridge 202 to a depth reaching the layer of second conductivity type (p-type cladding layer 111), the third waveguide region $C_3$ having a side face 204 formed to have an angle $\alpha$ of 20° from the resonator direction AA is formed at the same time when the first ridge is formed by etching down to the layer of first conductivity type (n-type cladding layer 106). Thus the laser device of the sixth embodiment which has the third waveguide region $C_3$ in addition to the first waveguide region $C_1$ and the second waveguide region $C_2$ is made. In the laser device of the sixth embodiment constituted as described above, light which has been guided while spreading in the active layer plane in the second waveguide region $C_2$ is reflected on the side face 204 of the third waveguide region $C_3$ and is directed toward the first waveguide region $C_1$, and therefore the light can be guided smoothly. That is, as the light guided in the direction of the resonator falls on the side face 204 with an incident angle of $(90°-\alpha)$, the light undergoes total reflection on the side face 204 and can be guided into the stripe waveguide region without loss. In the second waveguide region $C_2$ and the third waveguide region $C_3$, effective difference in the refractive index is provided in the active layer plane by means of the second ridge 202 which is provided on the layer of second conductivity type (p-type cladding layer 111), and the stripe waveguide region is formed. In the third waveguide region $C_3$, light guided while coming out of the region right below the second ridge can be guided satisfactorily into the first waveguide region $C_1$.

In the sixth embodiment, as described above, since the side face 204 is inclined against the side face of the first ridge 201 in the first waveguide region $C_1$, light can be smoothly guided. The boundary between the side face 204 and the second waveguide region $C_2$ may also be connected directly to the second waveguide region $C_2$ without bending as shown in FIG. 13.

In the laser device of the sixth embodiment, as described above, since light guided in the stripe waveguide region in the active layer plane or coming out thereof in the second waveguide region $C_2$ can be efficiently guided into the first waveguide region $C_1$, the device characteristics can be improved. In the laser device of the sixth embodiment, in particular, threshold of current density can be decreased and slope efficiency can be improved.

[Embodiment 7]

The laser device of the seventh embodiment is constituted similarly to the first embodiment except for constituting the first waveguide region $C_1$ in 2-step configuration where the side face is formed in two steps.

Specifically, in the seventh embodiment, after forming the striped ridge by etching to such a depth that does not reach the active layer, a ridge wider than the stripe width of the ridge is etched down to the n-type cladding layer 106 in a portion where the first waveguide region is to be formed, thereby to form the 2-step ridge.

Figure 14A:
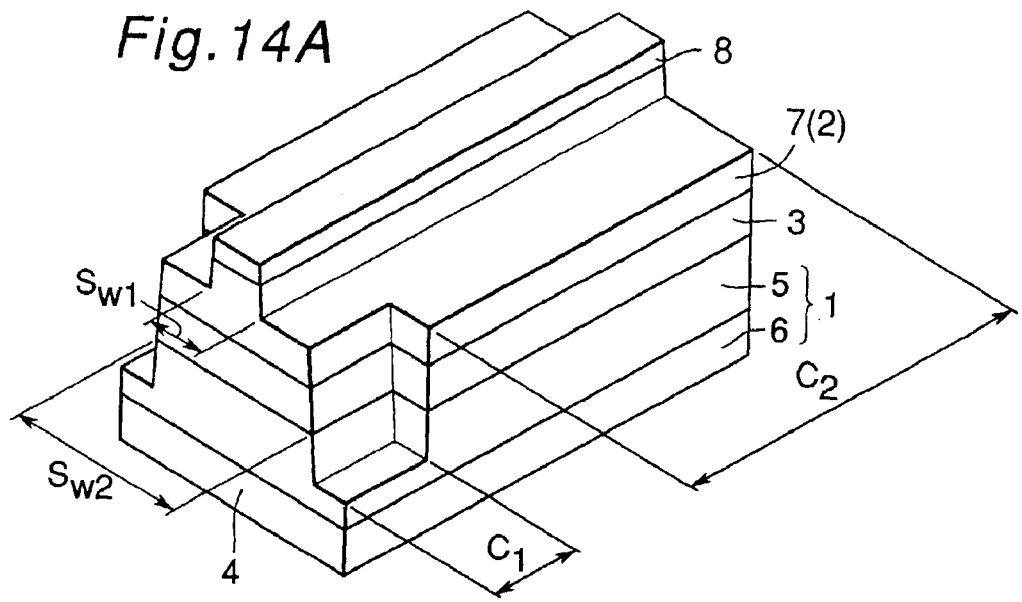
FIG. 14A is a perspective view of the laser device according to the seventh embodiment of the present invention.
Figure 14B:
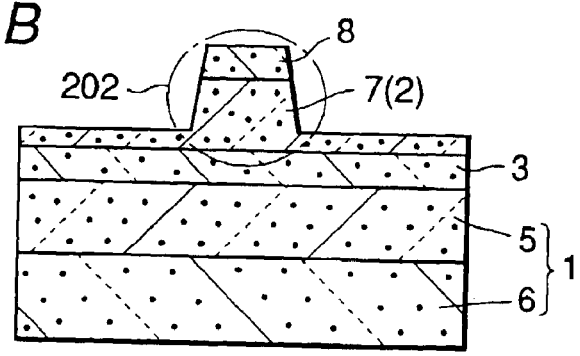
FIG. 14B is a sectional view of the second waveguide region of the laser device according to the seventh embodiment of the present invention.
Figure 14C:
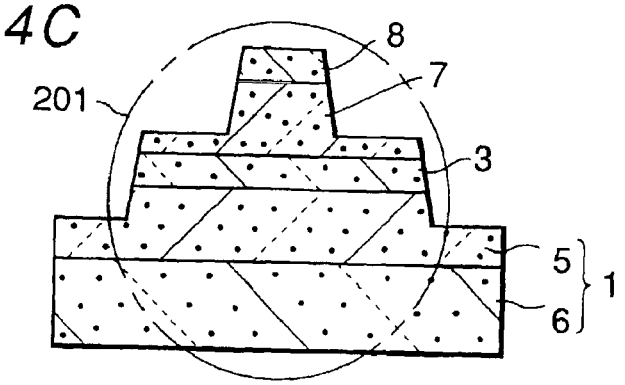
FIG. 14C is a sectional view of the first waveguide region of the laser device according to the seventh embodiment of the present invention.

FIG. 14A is a perspective view showing the laser device structure of the seventh embodiment, FIG. 14C is a sectional view of the first waveguide region $C_1$ and FIG. 14B is a sectional view of the second waveguide region $C_2$. In the laser device of the seventh embodiment, as shown in FIG. 14A, the first waveguide region $C_1$ is formed in the form of 2-step ridge comprising an upper ridge of width $S_{w1}$ and a lower ridge of width $S_{w2}$. In the first waveguide region $C_1$, since the active layer is located in the lower ridge, and width of the active layer 3 is determined by the width $S_{w2}$ of the lower ridge, the waveguide can be considered to be formed substantially by the lower ridge. The structure of the seventh embodiment makes it easier to control the width $S_{w2}$ of the lower ridge compared to a case where the first ridge is formed as in the first embodiment or the like and, as a result, width of the active layer of the first waveguide region can be formed accurately. This is because, while etching is carried out in two steps with a single mask when the first ridge 201 for constituting the first waveguide region $C_1$ is formed by the method shown in FIG. 5, a step is formed in the boundary between the portion shared by the second ridge which has been formed first and the portion below thereof during the second etching to such a depth that reaches the layer of first conductivity type, thus making it unreliable to accurately control the width of the lower portion.

According to the seventh embodiment, in contrast, after etching the upper ridge in the etching process common to the second ridge, the lower ridge is formed through etching by making and using a mask different from the mask used when forming the upper ridge. Consequently, the lower ridge can be formed with accurate width while the active layer 3 located in the lower ridge can also be formed with accurate width.

Thus according to this embodiment, laser device having characteristics equivalent to the first embodiment can be manufactured with less variations due to manufacturing. In other words, the laser device of the seventh embodiment is advantageous with respect to manufacturing.

[Embodiment 8]

The laser device structure of the eighth embodiment has the third waveguide region formed between the first waveguide region and the second waveguide region, with the third waveguide region being constituted differently from the sixth embodiment.

Figure 15A:
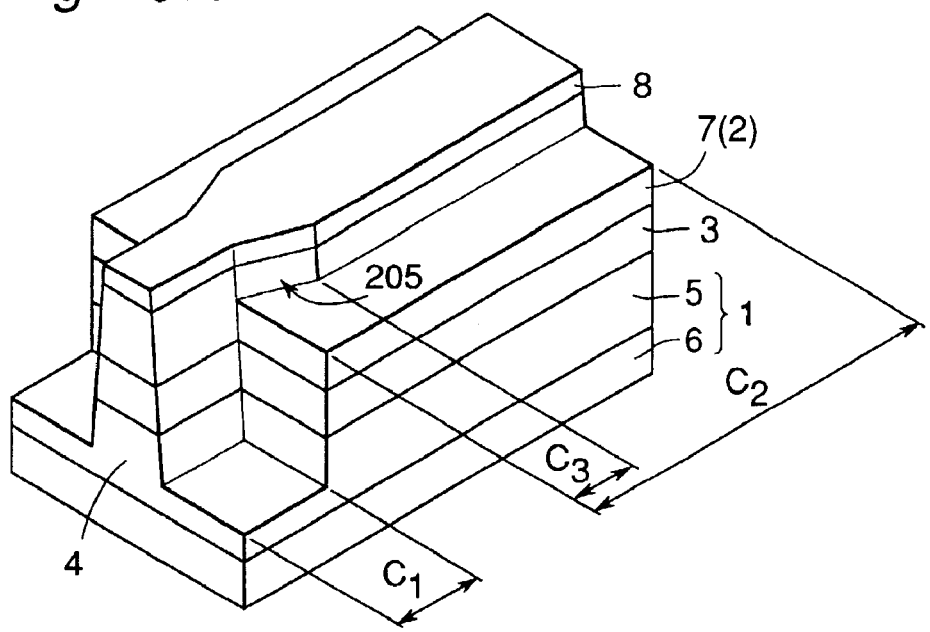
FIG. 15A is a perspective view of the laser device according to the eighth embodiment of the present invention.

Specifically, in the laser device structure of the eighth embodiment, the third waveguide region $C_3$ is constituted from a third ridge provided on the p-type cladding layer 111 and the p-type contact layer 112 as shown in FIG. 15A, with the third ridge decreasing in width toward the first waveguide region.

Thus according to the eighth embodiment, forming the third waveguide region makes it possible to connect the first waveguide region and the second waveguide region, which have different widths, without changing the width of the waveguide discretely.

Figure 15B:
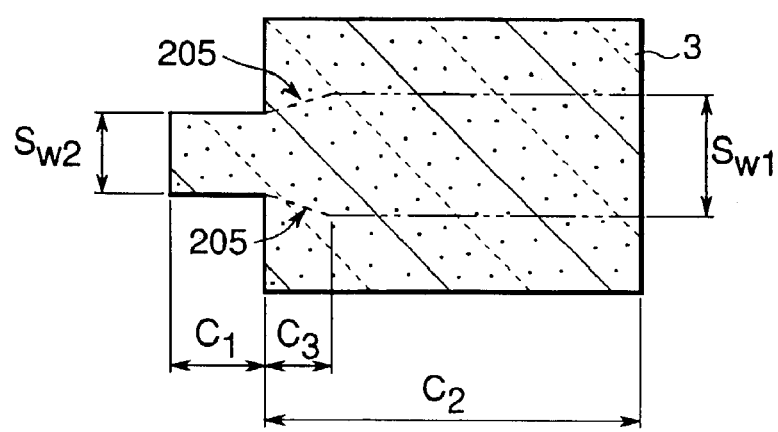
FIG. 15B is a cross sectional view of the laser device according to the eighth embodiment of the present invention.

FIG. 15A is a perspective view showing the laser device structure of the eighth embodiment, and FIG. 15B is a cross sectional view of the active layer. In FIG. 15B, width $S_{w1}$ is the width of the second ridge at the base thereof, and width $S_{w2}$ is the width of the active layer portion of the first ridge.

The imaginary line (a dash and two dots line) in FIG. 15B is the projection of the second ridge and the third ridge onto the cross sectional plane of the active layer. Since the waveguides of the second waveguide region and the third waveguide region are constituted by providing the effective difference in the refractive index in the active layer corresponding to the second ridge and the third ridge, the imaginary line (a dash and two dots line) can be considered to substantially represent the waveguides of the second waveguide region and the third waveguide region.

The laser device structure of the eighth embodiment manufactured as described above shows excellent characteristics similarly to that of the first embodiment.

[Embodiment 9]

The ninth embodiment is an example of manufacturing the laser device which is constituted similarly to the first embodiment by a method different from the first embodiment.

In the ninth embodiment, the second ridge is formed after the first ridge has been formed.

Specifically, after forming the layers one on another similarly to the first embodiment, the first protective film 161 having stripe shape is formed on the surface of the laminate as shown in FIG. 5A. Then as shown in FIG. 6A, the third protective film 163 is formed except for a part of the first protective film 161 (where the first waveguide region is to be formed), and both sides of the first protective film 161 are etched to such a depth as the lower cladding layer 5 (n-type cladding layer 106) is exposed, thereby to form the first ridge 201 as shown in FIG. 6B. Then after temporarily removing the third protective film 163, the third protective film 163 is formed to cover the first ridge 201 as shown in FIG. 6C. Under this condition, portions where the second waveguide region is to be formed except for those on both sides of the first protective film 161 are covered by at least one of the first protective film and the third protective film 163. After creating this state, the second ridge is formed by etching the regions which are not covered by the first protective film 161 and the third protective film 163 to such a depth that does not reach the active layer.

At this time, width and height of ridges that constitute the first waveguide region $C_1$ and the second waveguide region $C_2$ are set to similar values as the first embodiment. Then the third protective film 163 provided on the first waveguide region $C_1$ is removed to leave only the first protective film 161 which is the striped mask, followed by a subsequent process similar to the first embodiment wherein the second protective film (buried layer) is formed on the side face of the stripe and on the surface of the nitride semiconductor layer which continues therefrom. Then the laser device is obtained similarly to the first embodiment. According to the method of the ninth embodiment described above, although the number of processes increases compared to the method of the first embodiment, laser device similar to that of the first embodiment can be manufactured.

[Embodiment 10]

The tenth embodiment is an example of manufacturing the laser device by using a nitride semiconductor substrate, with the basic device constitution having the second waveguide region $C_2$ of the structure shown in FIG. 8 and the first waveguide region $C_1$ of the structure shown in FIG. 9.

(Substrate 101)

In the tenth embodiment, the nitride semiconductor substrate made of GaN 80 μm thick which is fabricated as follows is used.

As the substrate of different material where on the nitride semiconductor is to be grown, a sapphire substrate measuring 425 μm in thickness and 2 inches in diameter with the principal plane lying on the C plane and orientation flat surface on the A plane is prepared. The wafer is set in a MOCVD reaction vessel. Then with the temperature set to 510° C. and using hydrogen as the carrier gas and ammonia and TMG (trimethyl gallium) as the stock material gas, a low-temperature growth buffer layer made of GaN is formed to a thickness of 200 Å on the sapphire substrate, followed by the growth of a base layer made of undoped GaN is grown to a thickness of 2.5 μm by using TMG and ammonia as the stock material gas, with the temperature set to 1050° C. A plurality of masks made of $SiO_2$ and in the shape of stripe each 6 μm wide are formed in parallel to each other, in a direction of θ=0.3° from the direction perpendicular to the orientation flat surface (A plane) of the sapphire substrate, so that the interval between masks (aperture of the mask) is 14 μm. Then the substrate is returned to the MOCVD apparatus where the undoped GaN is grown to a thickness of 15 μm. In this process, GaN which is grown selectively through the mask aperture grows mainly in the longitudinal direction (thickness direction) in the mask aperture, and grows in the lateral direction over the mask, so that the base layer covering the mask and the mask aperture is formed. In the base layer which has grown as described above, occurrence of through dislocation in the nitride semiconductor layer that has grown laterally can be decreased. Specifically, through dislocation occurs in such a way as the dislocation density increases to about $10^{10}/cm^2$ over the mask aperture and around the center of the mask where fronts of growing nitride semiconductor bodies approaching laterally from both sides of the mask join, and the dislocation density decreases to about $10^8/cm^2$ over the mask except for the central portion thereof.

Then the wafer is placed in the HVPE apparatus where undoped GaN is grown to a thickness of about 100 μm on the base layer (the layer grown to about 100 μm thick will be referred to as thick film layer). Then the substrate of different material, the low-temperature growth buffer layer, the base layer and a part of the thick film layer are removed thereby to leave only the thick film layer (singularization) and obtain a GaN substrate 80 μm thick. Although the thick film layer formed by the HVPE may be made of a nitride semiconductor other than GaN, it is preferable to use GaN or AlN which makes it possible to easily grow thick nitride semiconductor layer with good crystallinity, according to the present invention. The substrate of different material may be removed either after forming the device structure which will be described later, or after forming the waveguide, or after forming the electrode. When the substrate of different material is removed before cutting the wafer into bars or chips, cleavage planes of the nitride semiconductor ({11-00} M plane, {1010} A plane, {0001} C plane approximated by hexagonal system) can be used when cutting or cleaving into chips.

(Base Layer 102)

A base layer 102 is formed to a thickness of about 15 μm on the nitride semiconductor substrate so as to grow in the lateral direction as well. By using a striped $SiO_2$ mask similarly to the base layer used when fabricating the nitride semiconductor substrate.

[Buffer Layer 103]

A buffer layer 103 made of undoped AlGaN with Al proportion of 0.01 is formed on the base layer 102. Although the buffer layer 103 may be omitted, in case the substrate which uses lateral growth is made of GaN, or in case the base layer formed by using lateral growth is made of GaN, it is preferable to form the buffer layer 103 since the occurrence of pits can be decreased by using the buffer layer 103 made of a nitride semiconductor which has lower thermal expansion coefficient than tat of GaN, namely $A_aGa_{1-a}N$ ($0<a\leq1$) or such material. That is, pits are likely to occur when a nitride semiconductor is grown on other type of nitride semiconductor which has been grown in a process accompanied by lateral growth as in the case of the base layer 102, while the buffer layer 103 has an effect of preventing the occurrence of pits.

It is also preferable that the proportion a of Al contained in the buffer layer 103 is $0<a<0.3$, which makes it possible to form a buffer layer of good crystallinity. After forming the buffer layer 103, an n-type contact layer of composition similar to that of the buffer layer may be formed, thereby giving the buffer effect also to the n-type contact layer 104. That is, the buffer layer 103 decreases the pits and improves the device characteristics when at least one layer thereof is provided between the laterally-grown layer (GaN substrate) and the nitride semiconductor layer which constitutes the device structure, or between the active layer within the device structure and the laterally-grown layer (GaN substrate), and more preferably on the substrate side in the device structure, between the lower cladding layer and the laterally-grown layer (GaN substrate). When a buffer layer which also performs the function of the n-type contact layer, proportion a of Al contained therein is preferably within 0.1 so as to obtain good ohmic contact with the electrode. The buffer layer formed on the base layer 102 may be grown at a low temperature in a range from 300 to 900° C. similarly to the buffer layer which is provided on the substrate of different material described above, the effect of reducing the pits can be improved by single crystal growth at a temperature in a range from 800 to 1200° C. Moreover, the buffer layer 103 may be either doped with n-type or p-type impurity or undoped, although it is preferable to grow without doping in order to obtain good crystallinity. In case two or more layers of buffer layer are provided, the layer can be formed while changing the concentration of n-type or p-type impurity and/or the proportion of Al.

(n-type Contact Layer 104)

The n-type contact layer 104 made of $Al_{0.01}Ga_{0.99}N$ doped with Si in a concentration of $3\times10^{18}/cm^3$ is formed to a thickness of 4 μm on the buffer layer 103.

(Crack Preventing Layer 105)

A crack preventing layer 105 made of $In_{0.06}Ga_{0.94}N$ is formed to a thickness of 0.15 μm on the n-type contact layer 104.

(n-type Cladding Layer 106)

An n-type cladding layer 106 of super lattice structure to total thickness of 1.2 μm on the crack preventing layer 105.

Specifically, the n-type cladding layer 106 is formed by forming undoped $In_{0.05}Ga_{0.95}N$ to a thickness of 25 μm and GaN layer doped with Si in a concentration of $1\times10^{19}/cm^3$ alternately one on another.

(n-type Optical Guide Layer 107)

An n-type optical guide layer 107 made of undoped GaN of a thickness of 0.15 μm is formed on the n-type cladding layer 106.

(Active Layer 108)

The active layer 108 of multiple quantum well structure with total thickness of 550 Å on the n-type optical guide layer 107.

Specifically, the active layer 108 is formed by forming the barrier layer (B) made of $In_{0.05}Ga_{0.95}N$ doped with Si in a concentration of $5\times10^{18}/cm^3$ with a thickness of 140 Å and a well layer (W) made of undoped $In_{0.13}Ga_{0.87}N$ with a thickness of 50 Å alternately in the order of (B)-(W)-(B)-(W)-(B).

(p-type Electron Confinement Layer 109)

The p-type electron confinement layer 109 made of p-type $Al_{0.3}Ga_{0.7}N$ doped with Mg in a concentration of $1\times10^{20}/cm^3$ is formed to a thickness of 100 Å on the active layer 108.

(p-type Optical Guide Layer 110)

The p-type optical guide layer 110 made of p-type GaN doped with Mg in a concentration of $1\times10^{18}/cm^3$ is formed to a thickness of 0.15 μm on the p-type electron confinement layer 109.

(p-type Cladding Layer 111)

A p-type cladding layer 111 of super lattice structure with total thickness of 0.45 μm is formed on the optical guide layer 110.

Specifically, the p-type cladding layer 111 is formed by forming undoped $Al_{0.05}Ga_{0.95}N$ of thickness 25 Å and p-type GaN layer doped with Mg in a concentration of $1\times10^{20}/cm^3$ of thickness 25 Å alternately one on another.

(p-type Contact Layer 112)

The p-type contact layer 112 made of p-type GaN doped with Mg in a concentration of $2\times10^{20}/cm^3$ is formed to a thickness of 150 Å on the p-type cladding layer 111.

After forming the device structure from the n-type contact layer 104 to the p-type contact layer 112 as described above, the n-type contact layer 104 is exposed, the 31 and the second waveguide region $C_2$ are formed by etching, and the second protective film 162 (buried layer) is formed on the side faces of the first ridge and the second ridge and on the nitride semiconductor layer surface which continues thereto, similarly to the first embodiment. At this time, the second ridge provided for constituting the second waveguide region $C_2$ is formed by etching the p-type optical guide layer 110 on both sides of the second ridge to such a depth as the film thickness becomes 0.1 μm.

Now the method for forming the resonating end face of the laser device according to the tenth embodiment will be described below.

In the tenth embodiment, the resonating end faces are formed efficiently by disposing a pair of laser devices so that the two devices oppose each other in a symmetrical arrangement with respect to a plane of symmetry.

Specifically, the second waveguide regions $C_2$ each 645 μm in length are formed on both sides of the first waveguide region $C_1$ which is 10 μm long (the first waveguide regions of a pair of laser devices coupled) (refer to FIG. 17B at portions IIIb and IVb).

The outer end faces of the second waveguide regions $C_2$ on both sides thereof are formed at the same time as the etching for exposing the n-type contact layer.

Then similarly to the first embodiment, the n-type electrode 121 and the p-type electrode 120 are formed on the surfaces of the n-type contact layer 104 and the p-type contact layer 112.

Then an insulation film (reflector film) 164 made of a dielectric multi-layered film is formed over the entire surfaces which are exposed including the end faces of the second waveguide region and the side faces of each ridge provided for constituting the waveguide regions.

This process forms the insulation film 164 which functions as a reflector film at the end face of the second waveguide region $C_2$ and functions as an insulation film in other parts (particularly functions to prevent short-circuiting between p-n electrodes). In the tenth embodiment, the p-type electrode 120 is formed on a part of the p-type contact layer 112 with a width smaller than the stripe width of the p-type contact layer 112., unlike those shown in FIGS. 8 and 9. The p-type electrode 120 is formed only on the top of the second waveguide region $C_2$ in the direction of stripe. The p-type electrode 120 is formed at a small distance from the end of the second waveguide region $C_2$.

Then a part of the insulation film 164 provided on the n-type and p-type electrodes is removed to expose the electrodes, thereby to form pad electrodes 122, 123 which make electrical connection on the surfaces of the electrodes.

Then at around the center of the first waveguide region $C_1$ which is 10 μm (refer to line E—E in FIG. 17B), the nitride semiconductor is cleaved along M surface into bar shape, and the bars are cleaved in parallel to the resonator direction along A plane perpendicular to the M plane of cleaving between the devices, thereby to obtain chips.

The laser chip obtained as described above has the first waveguide region $C_1$ having length of about 5 μm and the second waveguide region $C_2$ having length of 645 μm, with the end face of the first waveguide region $C_1$ being used as the light emitting side, similarly to the first embodiment.

The laser device obtained as described above has threshold current density of 2.5 kA/cm² and threshold voltage of 4.5V at room temperature, with oscillation wavelength of 405 nm and aspect ratio of 1.5 for the laser beam emitted. With continuous oscillation at 30 mW, the laser device can operate with a high output power for 1000 hours or longer. The laser device is capable of continuous oscillation in an output range from 5 mW to 80 mW, and has beam characteristics suited as the light source for optical disk systems in this output range.

[Embodiment 11]

The laser device of the eleventh embodiment is constituted by using Si-doped n-type GaN which is 80 μm thick as the substrate 101 instead of the undoped GaN which is 80 μm thick of the tenth embodiment, The substrate 101 made of Si-doped n-type GaN is made by forming a low temperature growth buffer layer on a substrate of different material, forming a base layer in a growing process which is accompanied by lateral growth, forming a thick film of Si-doped n-type GaN to a thickness of 100 μm by HVPE, and then removing the substrate of different material.

In the eleventh embodiment, the buffer layer 103 made of Si-doped $Al_{0.01}Ga_{0.99}N$ is formed on the n-type GaN substrate 101, and thereon the layers are formed one on another from the n-type contact layer 104 to the p-type contact layer 112 similarly to the first embodiment.

Then a separation groove is formed by etching so as to expose the surface of the p-type contact layer 112 in order to define the region where the waveguide regions of the deices are to be formed. In the eleventh embodiment, unlike the first embodiment, it is not necessary to provide a space for forming the n-type electrode on the exposed surface of the n-type contact layer in order to make a structure of opposing structure of electrodes on both sides of the substrate without forming a pair of positive and negative electrodes on the same side. Therefore, adjacent devices can be disposed nearer to each other than in the case of the tenth embodiment.

In the eleventh embodiment, different regions are defined by exposing the n-type contact layer by etching, but the following process may also be carried out without etching for achieving opposing arrangement in this constitution. When forming the separation groove, the layer between the n-type contact layer and the substrate may be exposed, or the separation groove may be formed so as to expose the substrate. Moreover, in case the separation groove is formed by exposing the substrate, the substrate may be etched midway thereby to expose the substrate.

The regions for defining the devices may not be necessarily formed for each device, and a region to constitute two devices collectively may be formed as described in the tenth embodiment, or a region to constitute three devices collectively may be formed (for example, portions III and IV shown in FIGS. 17A, 17B are formed collectively).

Similarly in the direction perpendicular to the light guiding direction, a plurality of regions may be formed continuously without forming separation grooves between the devices.

Cracking and chipping in the active layer due to the impact of division can be avoided by forming the groove by etching deeper than the active layer and dividing along the groove (for example, portion A—A shown in FIG. 17A, FIG. 17B).

In the eleventh embodiment, the region for each device is separated to make the individual devices. Then similarly to the tenth embodiment, the stripe ridges for constituting the waveguide regions are formed and then the first waveguide region $C_1$ and the second waveguide region $C_2$ are formed in each region corresponding to each device. The first waveguide region $C_1$ is formed with stripe length of 10 μm.

Then similarly to the tenth embodiment, a p-type electrode of stripe shape having a width smaller than the width of the p-type contact layer is formed on the surface of the p-type contact layer only in the second waveguide region $C_2$. At this time, the p-type electrode of stripe shape is formed in such a length that does not reach the end face of the second ridge which constitutes the second waveguide region $C_2$ so as to keep away a little therefrom.

Then an n-type electrode is formed on the back side of the substrate (the surface which opposes the substrate surface whereon device structure is formed), Then similarly to the tenth embodiment, the insulation film (reflector film) 164 made of dielectric multi-layered film is formed over substantially the entire surface on the side of the substrate where the device structure is formed and, with a part of the p-type electrode being exposed, a pad electrode is formed so as to electrically connect to the exposed p-type electrode.

Last, laser devices in the form of chips are obtained by cleaving at the D—D cutting position located substantially at the center of the first waveguide region $C_1$ as the cutting direction perpendicular to the resonator and along the M plane of the substrate at the A—A cutting position between the devices thereby to separate into bars and then cleaving between the devices along A plane perpendicular to the cleavage plane.

The laser device obtained as described above has the cleavage surface at the end of the first waveguide region $C_1$ and the etched end face whereon the reflector film is provided at the end of the second waveguide region $C_2$ as the resonance end faces, and is capable of laser oscillation. The laser device obtained as described above has excellent laser characteristics similar to those of the tenth embodiment.

[Embodiment 12]

The laser device of the twelfth embodiment is made by forming the resonator end faces simultaneously as etching down to the n-type contact layer, and dividing the substrate between the resonator end faces along the AA cut surface in I and II of FIG. 17A after etching down to the substrate, in the eleventh embodiment. At this time, the dimension of the portion protruding from the resonator end face is set to 3 μm. The laser device obtained as described above has excellent laser characteristics similar to the device characteristics and optical characteristics of the eleventh embodiment.

[Comparative Embodiment 1]

As a first comparative embodiment, a laser device having the second waveguide region $C_2$ formed over the entire length thereof without forming the first waveguide region $C_1$ in the first embodiment is fabricated.

In the first comparative embodiment, different layers which constitute the device structure are stacked one on another similarly to the first embodiment. Then as shown in FIG. 5B, the second stripe ridge is formed to extend from one end face of the device to the other end face, by using the first protective film 161 as the mask.

Then a protective film made of $ZrO_2$ is formed on the side face of the first ridge formed over the entire length thereof and on the surfaces on both sides thereof which are exposed by etching. The wafer is then dipped in hydrofluoric acid thereby to remove the first protective film 161 by lift-off. Then similarly to the first embodiment, the resonance end face and the electrodes are formed thereby to obtain the laser device of the first comparative embodiment which has only the second ridge for constituting the second waveguide region $C_2$.

In the laser device of the first comparative embodiment fabricated as described above, it is difficult to effectively suppress the unnecessary transverse mode, thus resulting in lower stability of the transverse mode and frequent occurrence of kink in the current-optical output characteristic.

Particularly in a high output range of large optical output power, for example, output power of 30 mW which is required to write data in an optical disk system, shift of the transverse mode is likely to occur. Also because the device characteristics are sensitive to the dimensional accuracy of the second ridge of stripe shape, significant variations occur among the devices thus making it difficult to improve the yield of production as shown in FIG. 10. The aspect ratio of the laser beam spot mostly fall within a range from 2.5 to 3.0, which means significantly low yield of production provided that the criteria of acceptance for aspect ratio is 2.0 or lower.

Now the result of investigation conducted to verify the effects of the constitution of the laser device according to the present invention (service life of laser device, drive current and controllability of transverse mode) will be described below.

In the investigation, device constitution (laminated structure of semiconductor) similar to the first embodiment was used to fabricate the laser devices of different ridge height while changing the depth of etching, and the service life of laser device, drive current and controllability of transverse mode were evaluated on the laser devices.

FIG. 12 shows the service life of the laser device (tested with optical output power of 30 mW) for different depths of etching.

As shown in FIG. 12, when etching is carried out to a depth near the boundary of the p-type cladding layer and the p-type optical guide layer, device life becomes longest but the life becomes shorter when the etching depth is smaller. Also when etching near to the boundary of the p-type cladding layer and the p-type optical guide layer, the laser device decreases abruptly, indicating that there occurs an significantly adverse influence on the device life when the stripe waveguide region is formed by etching to a depth that reaches the active layer. When the device life is taken into consideration, therefore, it is better to etch to a depth which does not reach the p-type electron confinement layer. Also it can be understood that, when the ridge is formed by etching to a depth in a range of 0.1 $\mu$m above and below the boundary between the p-type cladding layer and the p-type optical guide layer, very long service life is obtained. When the confinement of light in the direction of thickness is taken into consideration, it is preferable to etch to such a depth which does not reach the p-type guide layer. With this respect, it is more preferable to carry out etching to a depth of 0.1 $\mu$m above the interface of the p-type cladding layer and the p-type optical guide layer.

FIG. 10 is a graph showing the acceptance ratio for different depths of etching. From FIG. 10, it can be seen that a high acceptance ratio can be achieved by etching to a depth deeper than a point 0.1 $\mu$m above the interface of the p-type cladding layer and the p-type optical guide layer. The acceptance ratio shown in FIG. 10 indicates what proportion of devices which have proved capability to oscillate can oscillate in the fundamental single transverse mode at 5 mW, while the stripe width of the waveguide region at this time was 1.8 $\mu$m.

When etched to such a depth as 0.1 $\mu$m or more of the p-type cladding layer remains on both sides of the ridge, kinks occur abruptly thus leading to a significant decrease in the acceptance ratio.

FIG. 11 shows the drive voltage (with optical output of 30 mW) as a function of the depth of etching, with the width of the waveguide region being set to 1.8 $\mu$m for the investigation. As will be clear from FIG. 11, the drive current remains constant at 50 mA regardless of the depth of etching, when etching is carried out deeper than the mid point of the p-type optical guide layer (mid point in the direction of thickness) on the active layer side. When the depth of etching is decreased from the mid point of the p-type optical guide layer, the current gradually increases up to 0.1 $\mu$m above the boundary of the p-type cladding layer and the p-type optical guide layer, while the current sharply increases when the depth of etching is shallower than 0.1 $\mu$m above the boundary of the p-type cladding layer and the p-type optical guide layer (such a depth of etching that a thickness of 0.1 $\mu$m or more of the p-type cladding layer remains on both sides of the ridge). When etched to such a depth as thickness of 0.25 $\mu$m or more of the p-type cladding layer remains, it becomes impossible to achieve an optical output of 30 mW.

[Comparative Embodiment 2]

As a second comparative embodiment, a laser device having the first waveguide region formed over the entire length thereof without forming the second waveguide region in the first embodiment is fabricated.

In the second comparative embodiment, different layers which constitute the device structure are stacked one on another similarly to the first embodiment. Then as shown in FIG. 5A, the ridge of stripe shape which constitutes the first waveguide region $C_1$ is formed by forming the first protective film 161 of stripe shape and etching the regions on both sides of the first protective film to such a depth that reaches the lower cladding layer 5. Then a protective film made of $ZrO_2$ is formed on the top surface and the side face of the ridge and on the surfaces on both sides thereof which are exposed by etching. The wafer is then dipped in hydrofluoric acid thereby to remove the first protective film 161 by lift-off. Then similarly to the first embodiment, the resonance end face and the electrodes are formed thereby to obtain the laser device which has only the first waveguide region $C_1$ with the sectional structure as shown in FIG. 9. In the second comparative embodiment, the stripe ridge is formed by etching to such a depth as thickness of 0.2 $\mu$m of the p-type cladding layer remains on both sides of the ridge similarly to the first waveguide region $C_1$ of the first comparative embodiment.

The laser device thus obtained has shorter service life than that of the first embodiment since the stripe is formed by etching deeper than the active layer, and does not make a practically useful laser device with the service life as short as shown in FIG. 12.

The laser device of the present invention has the first waveguide region $C_1$ and the second waveguide region $C_2$ as the waveguide in the resonator direction, and therefore provides excellent device reliability and controllability of transverse mode. The present invention also provides laser devices of various device characteristics with simple design modifications.

While it has been difficult to achieve excellent device characteristics of conflicting items such as practical level of device reliability and stable oscillation in the transverse mode at the same time, the laser device of the present invention combines excellent productivity, reliability and device characteristics. Moreover, it is made possible to obtain laser beams of various spot shapes and various aspect ratios by providing the first waveguide region $C_1$ partially on the light emitting side of the resonance end face. Thus the present invention is capable of achieving various beam characteristics and has a great effect of expanding the range of applications of laser device.

In the nitride semiconductor laser device of the prior art, satisfactory yield of production and productivity can be achieved only with striped laser device because of the difficulty in the regrowth of crystal and in the implantation of ion such as proton. When the active layer having nitride semiconductor which includes In, significant damage is caused and the service life of the device decreases significantly, and therefore only the effective refractive index type laser device could be selected. In contrast, the laser device of the present invention has the first waveguide region $C_1$ and the second waveguide region $C_2$ and therefore achieves controllability of transverse mode and excellent beam characteristics while ensuring reliability of the device. Also the device structure allows manufacturing with high yield of production even in volume production and makes it possible to apply and drastically proliferate the nitride semiconductor laser device. Moreover, when used as the light source for an optical disk system of high recording density, such an excellent laser device can be provided that is capable of operation over 1000 hours with 30 mW of output power and aspect ratio in a range from 1.0 to 1.5 without shift of transverse mode in the ranges of output power for both reading data (5 mW) and writing data (30 mW).

What is claimed is:

1. A semiconductor laser device comprising a laminate structure consisting of a semiconductor layer of first conductivity type, an active layer and a semiconductor layer of second conductivity type, which is different from the first conductivity type, that are stacked in order, said laminate structure having a waveguide region to guide a light in a direction perpendicular to the direction of width, said waveguide region being formed by restricting the light from spreading in the direction of width in the active layer and in the proximity thereof,
wherein the waveguide region has a first waveguide region and a second waveguide region, the first waveguide region being a region where light is confined within the limited active layer by means of a difference in the refractive index between the active layer and the regions on both sides of the active layer by limiting the width of the active layer, and the second waveguide region being a region where the light is confined therein by providing effective difference in refractive index in the active layer.

2. The semiconductor laser device according to claim 1; wherein said first waveguide region has the active layer of which width is restricted by forming a first ridge so as to include the active layer,
wherein said second waveguide region constituted by including a region having effectively higher refractive index caused by forming a second ridge in the layer of the second conductivity type.

3. The semiconductor laser device according to claim 2; wherein said first ridge is formed by etching both sides of the first ridge until the layer of the first conductivity type is exposed and said second ridge is formed by etching both sides of the second ridge so that a part of the layer of the second conductivity type remains on the active layer.

4. The semiconductor laser device according to claim 3; wherein a thickness of the layer of the second conductivity type located on the active layer on both sides of the second ridge is 0.1 μm or less.

5. The semiconductor laser device according to claim 2; wherein said second ridge is longer than said first ridge.

6. The semiconductor laser device according to claim 2; wherein said first waveguide region includes one resonance end face of the laser resonator.

7. The semiconductor laser device according to claim 6; wherein said one resonance end face is a light emitting face.

8. The semiconductor laser according to claim 2; wherein a length of said first waveguide region is 1μm or more.

9. The semiconductor laser device as in one of claims 1–8; wherein said semiconductor layer of the first conductivity type, said active layer and said semiconductor layer of the second conductivity type are formed from nitride semiconductor respectively.

10. The semiconductor laser device according to claim 9; wherein said active layer is constituted from a nitride semiconductor layer which includes In.

11. The semiconductor laser device according to claim 9; further comprising insulation films on both sides of said first ridge and on both sides of said second ridge, said insulation films being made of a material selected from the group consisting of oxides of Ti, V, Zr, Nb, Hf and Ta and compounds SiN, BN, SiC and AIN.

12. A semiconductor laser device comprising;
a laminate structure being consisted of a layer of the first conductivity type, an active layer and a layer of the second conductivity type that is different from the first conductivity type being stacked in order, said laminate structure being provided with a stripe waveguide region,
wherein said stripe waveguide region has at least a first waveguide region $C_1$ in which a stripe-shaped waveguide based on absolute refractive index and a second waveguide region $C_2$ in which a stripe-shaped waveguide based on effective refractive index, which are arranged in the direction of the resonator.

13. The semiconductor laser device according to claim 12; wherein the absolute refractive index of said first waveguide region $C_1$ is achieved by means of the stripe ridge which is provided so as to include the layer of the first conductivity type, the active layer and the layer of the second conductivity type, and the effective refractive index of said second waveguide region $C_2$ is achieved by means of the stripe ridge which is provided in the layer of second conductivity type.

14. A semiconductor laser device comprising a laminate structure including a layer of a first conductivity, an active layer and a layer of a second conductivity type that is different from the first conductivity type being stacked in order, said laminate structure being provided with a waveguide region of stripe configuration, wherein said stripe waveguide region has at least a second waveguide region where a portion of the layer of the second conductivity type is removed and a first stripe ridge is provided in the layer of the second conductivity type, and a first waveguide region $C_1$ where portions of the layer of first conductivity type, the active layer and the layer of second conductivity type are removed and a second stripe ridge is provided in the layer of the first conductivity type, which are arranged in a direction of a resonator.

15. The semiconductor laser device as in one of claims 12–14;

wherein said first waveguide region and said second waveguide region are constituted by removing a part of the laminate structure and forming a ridge waveguide comprising a stripe ridge.

16. The semiconductor laser device according to claim 15;

wherein said a length of the second waveguide region is longer than said first waveguide region.

17. The semiconductor laser device according to claim 15;

wherein at least one of the resonance end faces of the semiconductor laser device is formed at the end of the first waveguide region.

18. The semiconductor laser device according to claim 17;

wherein a resonance end face formed on the end of the first waveguide region $C_1$ is a light emitting face.

19. The semiconductor laser device according to claim 17;

wherein a length of the first waveguide region which has the resonance end face on the end face thereof is 1 $\mu$m or longer.

20. The semiconductor laser device according to claim 12;

wherein said semiconductor layer of the first conductivity type, said active layer and said semiconductor layer of the second conductivity type are formed from nitride semiconductor respectively.

21. The semiconductor laser device according to claim 20;

wherein said active layer is constituted from a nitride semiconductor laser which includes In.

22. The semiconductor laser device according to claim 20;

wherein said semiconductor layer of the first conductivity type include n-type nitride semiconductor and said semiconductor layer of the second conductivity type include p-type nitride semiconductor.

23. The semiconductor laser device according to claim 22;

wherein said second waveguide region has a p-type cladding layer which includes p-type nitride semiconductor and the stripe ridge of the second waveguide region is formed while keeping the thickness of the p-type cladding layer is less than 0.1 $\mu$m.

24. The semiconductor laser device according to claim 20;

wherein a side faces of the stripe ridge of the first waveguide region and a side faces of the stripe ridge of the second waveguide region are exposed, and an insulation film is provided on the side face of the stripe ridge, said insulation film being made of a material selected from the group consisting of oxides of at least one element selected from Ti, V, Zr, Nb, Hf and Ta and at least one kind of compounds SiN, BN, SiC and AlN.

25. The semiconductor laser device according to claim 20;

wherein a width of said stripe ridge is in a range from 1 $\mu$m to 3$\mu$m.

\* \* \* \* \*